United States Patent
Takeuchi et al.

(10) Patent No.: US 6,342,751 B1
(45) Date of Patent: Jan. 29, 2002

(54) PIEZOELECTRIC/ELECTROSTRICTIVE DEVICE AND PRODUCTION METHOD THEREOF

(75) Inventors: Yukihisa Takeuchi, Nishikamo-Gun; Tsutomu Nanataki, Toyoake; Toshikazu Hirota, Kuwana; Koji Kimura, Nagoya, all of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/436,849

(22) Filed: Nov. 9, 1999

Related U.S. Application Data

(63) Continuation-in-part of application No. 09/242,642, filed on Dec. 28, 1998, now Pat. No. 6,239,534.

(30) Foreign Application Priority Data

Oct. 1, 1999 (JP) ............................................. 11-281522
Oct. 28, 1999 (JP) ............................................. 11-307844

(51) Int. Cl.⁷ .............................................. H01L 41/08
(52) U.S. Cl. ...................................... 310/330; 310/328
(58) Field of Search ................................. 310/321, 330, 310/331, 332, 328

(56) References Cited

U.S. PATENT DOCUMENTS 6,109,104 A * 8/2000 Fukuda et al. ............ 73/504.13
6,140,739 A * 10/2000 Arai et al. .................... 310/321

FOREIGN PATENT DOCUMENTS

JP          63-64640         3/1988
JP          10-136665        5/1998

* cited by examiner

*Primary Examiner*—Mark O. Budd
(74) *Attorney, Agent, or Firm*—Burr & Brown

(57) ABSTRACT

A piezoelectric/elecrostrictive device comprising a driving portion to be driven by a displacement of a piezoelectric/electrostrictive element, a movable portion to be operated based on drive of the driving portion, and a fixing portion for holding the driving portion and the movable portion. Driving portion comprises a pair of thin plates facing each other, and a film-like piezoelectric/electrostrictive element formed on the outer surface of at least one thin plate of the thin plates, and the fixing portion is coupled with the movable portion via the driving portion, a hole is defined by an inner wall of the driving portion, an inner wall of the movable portion, and an inner wall of the fixing portion, and a ratio a/b of the thickness a of the piezoelectric/electrostrictive device and the width b of the piezoelectric/electrostrictive device is 0.5 to 20.

23 Claims, 21 Drawing Sheets

PIEZOELECTRIC/ELECTROSTRICTIVE DEVICE AND PRODUCTION METHOD THEREOF

CROSS REFERENCE TO RELATED APPLICATION

This application is a continuation-in-part application of U.S. Application Ser. No. 09/242,642, filed Dec. 28, 1998, now U.S. Pat. 6,239,534, the entirety of which is incorporated herein by reference.

BACKGROUND OF THE INVENTION AND RELATED ART STATEMENT

The present invention relates to a piezoelectric/electrostrictive device having a movable portion being operated based on a displacement of a piezoelectric/electrostrictive element, or a piezoelectric/electrostrictive device capable of detecting a displacement of the movable portion by the piezoelectric/electrostrictive element, and more particularly relates to a piezoelectric/electrostrictive device which is superior in mechanical strength, impact resistance, and humidity resistance and in which the movable portion can be efficiently operated in a large magnitude.

In recent years, in the fields of optics, magnetic recording, precision machining, and the like, a displacement element capable of adjusting an optical path length or a position in sub-micron order has been required, and development has progressed of a displacement element utilizing a displacement due to the inverse piezoelectric effect or electrostrictive effect caused when a voltage is applied to a piezoelectric/electrostrictive material, for example, a ferroelectric substance or the like.

For example, as shown in FIG. 2, a piezoelectric actuator 21 in which a fixing portion 25, a movable portion 24 and a bridge beam 26 connecting the two, are integrally formed by providing a hole 28 on a board-like body composed of a piezoelectric/electrostrictive material, and an electrode layer 22 is further provided on the bridge beam 26, is disclosed in JP-A-10-136665.

In the actuator 21, when a voltage is applied to an electrode layer 22, the movable portion 24 can have an arc-shaped displacement or a rotational displacement in the plane of the board-like body, since the bridge beam 26 expands or contracts in a direction connecting the fixing portion 25 with the movable portion 24 by the inverse piezoelectric effect and the electrostrictive effect.

However, in the actuator 21, there is a problem that an operational quantity of the movable portion 24 is small, since the displacement in the expanding or contracting direction, namely, the in-plane direction of the board-like body of the piezoelectric/electrostrictive material, is transmitted per se to the movable portion.

Further, the actuator 21 has another problem that the actuator 21, having all the members thereof constituted with a piezoelectric/electrostrictive material which is fragile and comparatively heavy, is low in mechanical strength, and inferior in handling property, impact resistance and humidity resistance, and in addition the actuator 21 per se is heavy and is easily subjected to an effect of harmful vibrations, for example, residual vibrations or vibrational noises under high speed operation.

In order to solve above-described problems of the actuator 21, a proposition is made that the hole 28 is filled with an elastic filler; it is apparent, however, that efficiency of the displacement due to the inverse piezoelectric effect or the electrostrictive effect is lowered when the filler is added.

The present invention is made in view of such problems of the conventional art, and an object of the present invention is to provide: a displacement element in which a movable portion can be operated in a large magnitude, and which is hardly subject to an effect of harmful vibrations in operation, and is superior in mechanical strength, handling property, impact resistance, and humidity resistance; a sensor element capable of detecting vibrations of the movable portion in fine accuracy; and a fabricating method for the elements.

SUMMARY OF THE INVENTION

According to the present invention, firstly provided is a piezoelectric/electrostrictive device comprising a driving portion to be driven by a displacement of a piezoelectric/electrostrictive element, a movable portion to be operated based on driving of the driving portion, and a fixing portion for holding the driving portion and the movable portion, said piezoelectric/electrostrictive device being characterized in that the driving portion is formed of a pair of thin plates facing each other and a film-like piezoelectric/electrostrictive element formed on an outer surface of at least one thin plate of the thin plates, the fixing portion is coupled with the movable portion via the driving portion, a hole is defined by an inner wall of the driving portion, an inner wall of the movable portion, and an inner wall of the fixing portion, and a ratio a/b of the thickness a of the piezoelectric/electrostrictive device and the width b of the piezoelectric/electrostrictive device is 0.5 to 20.

Further, in the present invention provided is a piezoelectric/electrostrictive device characterized in that a ratio e/a of the maximum length e of a length of a hole in parallel with the longitudinal direction of the piezoelectric/electrostrictive device and the thickness a of the piezoelectric/electrostrictive device is 0.5 to 10, more preferably a ratio a/b of the thickness a of the piezoelectric/electrostrictive device and the width b of the piezoelectric/electrostrictive device is 1 to 10, and a ratio e/a of the maximum length e of the length of the hole in parallel with the longitudinal direction of the piezoelectric/electrostrictive device and the thickness a of the piezoelectric/electrostrictive device is 0.7 to 5.

Although a shape of the movable portion or the fixing portion changes depending on the mode of application as an element, normally, it is preferable to be in rectangular solid form. Further, one having at least two driving portions is preferable, since function as a plurality of elements can be effectively performed. A piezoelectric/electrostrictive element to be mounted on the driving portion is preferably a laminated-type piezoelectric/electrostrictive element laminated by a lower electrode, a piezoelectric/electrostrictive film, and an upper electrode. Further, more preferable is a piezoelectric/electrostrictive element in which the piezoelectric/electrostrictive element comprises a piezoelectric/electrostrictive film, and a first electrode and a second electrode each of a comb-type structure, and the first electrode and the second electrode are structured to alternatively bite with a gap of a predetermined width between each tooth of respective combs. A piezoelectric/electrostrictive device constituted of ceramics with a movable portion, thin plates, and a fixing portion integrally formed is preferable from the standpoint of fabricating cost. Further, it is preferable that the piezoelectric/electrostrictive device be made of a laminated body.

According to the present invention, secondly provided is a piezoelectric/electrostrictive device comprising a driving portion to be driven by a displacement of a piezoelectric/electrostrictive element, a movable portion to be operated based on driving of the driving portion, and a fixing portion for holding the driving portion and the movable portion, wherein the piezoelectric/electrostrictive device is characterized in that the driving portion is formed of a pair of thin plates facing each other and a film-like piezoelectric/electrostrictive element formed on an outer surface of at least one thin plate of the thin plates, the fixing portion is coupled with the movable portion via the driving portion, a hole is defined by an inner wall of the driving portion, an inner wall of the movable portion, and an inner wall of the fixing portion, and the thickness a of the piezoelectric/electrostrictive device is 100 $\mu$m to 2000 $\mu$m, and the width b of the piezoelectric/electrostrictive device is 100 $\mu$m to 2000 $\mu$m.

Further, provided are a piezoelectric/electrostrictive device characterized in that the thickness a of the piezoelectric/electrostrictive device is 200 $\mu$m to 1000 $\mu$m and the width b of the piezoelectric/electrostrictive device is 100 $\mu$m to 500 $\mu$m, and a piezoelectric/electrostrictive device characterized in that the thickness d of the thin plate of the piezoelectric/electrostrictive device is 2 $\mu$m to 100 $\mu$m, and further a piezoelectric/electrostrictive device characterized in that the maximum length e of a length of a hole in parallel with the longitudinal direction of the piezoelectric/electrostrictive device is 300 $\mu$m to 3000 $\mu$m, and furthermore a piezoelectric/electrostrictive device characterized in that the length f of the movable portion in parallel with the longitudinal direction of the piezoelectric/electrostrictive device is 50 $\mu$m to 2000 $\mu$m.

According to the present invention, thirdly provided is a piezoelectric/electrostrictive device comprising a driving portion to be driven by a displacement of a piezoelectric/electrostrictive element, a movable portion to be operated based on driving of the driving portion, and a fixing portion for holding the driving portion and the movable portion, said piezoelectric/electrostrictive device being characterized in that the driving portion is formed of a pair of thin plates facing each other and a film-like piezoelectric/electrostrictive element formed on at least a part of an outer surface of at least one thin plate of the thin plates, and having the width same as the width of the thin plate and/or a length which exceeds the length of the thin plate portion constituting the driving portion and reaches at least to a part of the moving portion, the fixing portion is coupled with the movable portion via the driving portion, and a hole is defined by an inner wall of the driving portion, an inner wall of the movable portion, and an inner wall of the fixing portion.

A piezoelectric/electrostrictive device in which a film-like piezoelectric/electrostrictive element formed on at least a part of an outer surface of at least one thin plate of the thin plates has the width same as the width of the thin plate is preferred because a generating force of the driving portion can be increased and there is an advantage that a displacement in larger magnitude can be obtained. Also preferable is a piezoelectric/electrostrictive device in which a ratio a/b of the thickness a of the piezoelectric/electrostrictive device and the width b of the piezoelectric/electrostrictive device is 1 to 10, and a ratio e/a of the maximum length e of a length of the hole in parallel with the longitudinal direction of the piezoelectric/electrostrictive device and the thickness a of the piezoelectric/electrostrictive device is 0.7 to 5. In this embodiment, in the same reasons as described above, preferable is a piezoelectric/electrostrictive device of which a movable portion and a fixing portion are in rectangular solid shape, and preferable is a piezoelectric/electrostrictive device having at least two driving portions. Furthermore, preferable is a piezoelectric/electrostrictive device having a length of a film-like piezoelectric/electrostrictive element formed on at least a part of an outer surface of at least one thin plate of the thin plates, which exceeds the length of the thin plate portion constituting the driving portion and reaches to at least a part of the movable portion. In this case as well, preferable is a piezoelectric/electrostrictive device in which a ratio a/b of the thickness a of the piezoelectric/electrostrictive device and the width b of the piezoelectric/electrostrictive device is 1 to 10, and a ratio e/a of the maximum length e of a length of the hole in parallel with the longitudinal direction of the piezoelectric/elecrostrictive device and the thickness a of the piezoelectric/electrostrictive device is 0.7 to 5. Of course, in the same reason as described above, preferable is a piezoelectric/electrostrictive device of which a movable portion and a fixing portion are in rectangular solid form, and preferable is a piezoelectric/electrostrictive device having at least two driving portions.

Furthermore, according to the present invention, fourthly provided is a fabricating method of a piezoelectric/electrostrictive device comprising a driving portion composed of thin plates facing each other and a film-like piezoelectric/electrostrictive element formed on the surface of at least one thin plate of the thin plates, and a fixing portion and a movable portion in rectangular solid form, and the thin plates facing each other are spanned so that side surfaces of the movable portion and the fixing portion are continuous, said fabricating method of the piezoelectric/electrostrictive device being characterized by including steps of preparing a green-sheet laminated body comprising at least one green sheet constituting thin plate and at least one green sheet with at least one hole formed thereon, sintering the green-sheet laminated body, and forming a piezoelectric/electrostrictive element on an outer surface of thin plates of the sintered body obtained.

Further, provided are a fabricating method of a piezoelectric/electrostrictive device wherein at least one green sheet constituting thin plates is a green sheet constituting the thin plates laminated by at least one green sheet with the at least one hole formed thereon, a fabricating method of a piezoelectric/electrostrictive device wherein at least one green sheet constituting thin plates is composed only of a green sheet constituting the thin plates, and at least one green sheet with at least one hole formed thereon is laminated by a desired number of green sheets each with at least one hole formed thereon, and a fabricating method of a piezoelectric/electrostrictive device wherein at least one green sheet with the at least one hole formed thereon is laminated with at least one green sheet constituting thin plates, and a fabricating method of a piezoelectric/electrostrictive device wherein a green-sheet laminated body is a green sheet including at least one green sheet with at least one hole formed thereon, and at least one green sheet with at least one hole formed thereon is a green sheet including one green sheet constituting thin plates, and further a piezoelectric/electrostrictive device is obtained by laminating the green sheet with at least one hole formed thereon through intermediary of one or a plurality of the laminated body.

In the meantime, provided are a fabricating method of a piezoelectric/electrostrictive device wherein a sintered body with a piezoelectric/electrostrictive element formed on an outer surface of thin plates is further cut into each desired units and the cut body is heat-treated at 300° C. to 800° C., and a fabricating method for a piezoelectric/electrostrictive device wherein, when laminating a green sheet with at least one hole formed thereon in at least a plurality of layers, a green sheet, mounted on a plastic film, with at least one hole formed thereon, is laminated on the outer-most layer of the laminated body of green sheets each with at least one hole formed thereon, and the hole is accurately aligned, and the fabricating method includes a step of removing the plastic film. The plastic film is preferably a poly(ethylene terephthalate) film.

In a piezoelectric/electrostrictive device according to the present invention, it is preferable, as aforementioned, to have a movable portion, thin plates, and a fixing portion in integrally formed ceramics, and it is more preferable to have the moving portion, the thin plates, and the fixing portion composed of fully-stabilized zirconia or partially-stabilized zirconia, and it is specifically preferable to have a laminated body at least comprising a movable portion, thin plates, and a fixing portion.

Further, in a piezoelectric/electrostrictive device according to the present invention, it is preferable that a piezoelectric/electrostrictive film constituting a piezoelectric/electrostrictive element is composed of materials including lead zirconate, lead titanate, and lead magnesium niobate as a major component, and materials composed of sodium bismuth titanate as a major component is also preferable. Details of materials to be used is hereinafter described.

Furthermore, according to the present invention, provided is an optical shutter characterized in that the optical shutter is for controlling transmission and shielding of the light by relatively moving two shields, and at least one of the shields is mounted on a movable portion of the above-described piezoelectric/electrostrictive device.

DESCRIPTION OF PREFERRED EMBODIMENTS

Figure 1:
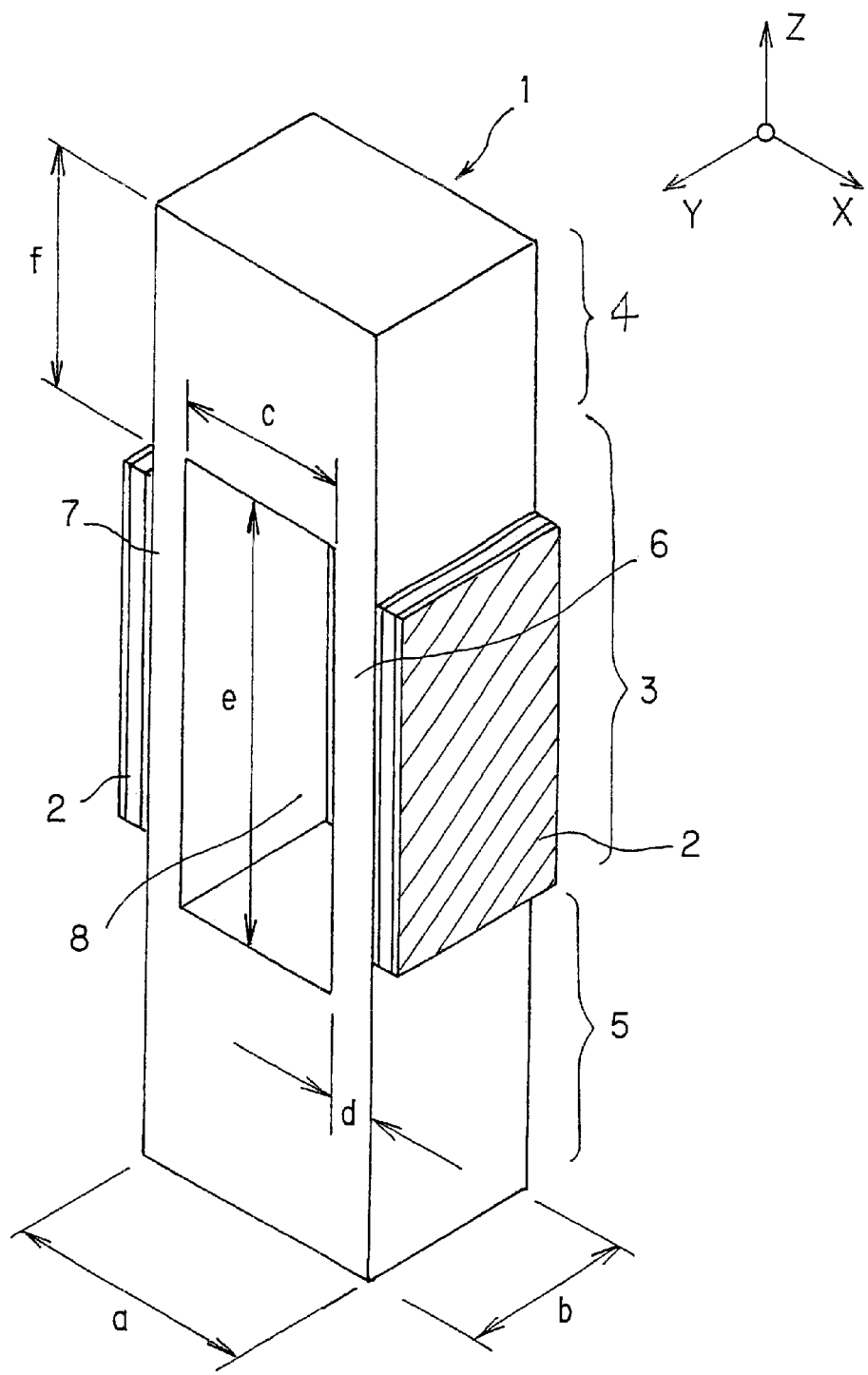
FIG. 1 shows a schematic perspective view of an embodiment of a piezoelectric/electrostrictive device of the present invention.

A piezoelectric/electrostrictive device of the present invention is hereinafter described with reference to the drawings. The present invention is not restricted to embodiments shown in the drawings.

In the description given hereinafter, "piezoelectric" may mean "piezoelectric and/or electrostrictive". Further, "length" means a distance in the direction connecting a movable portion with a fixing portion, namely in the Z-axis direction in the drawings, "width" means a distance in the direction penetrating through a hole, namely in the Y-axis direction in the drawings, and "thickness" means a distance in the laminating direction of a piezoelectric element relative to thin plates, namely in the X-axis direction in the drawings. Furthermore, in the drawings, those having the same or the similar function are denoted, in principle, by the same symbols.

1. Embodiments of Device

In the present specification, "a piezoelectric/ electrostrictive device (hereinafter simply referred to as "device")" is a notion covering an element where electric energy is converted into mechanical energy, and vice versa, by way of a piezoelectric/electrostrictive material. Consequently, the element is preferably used as an active element of a variety of actuators, vibrators, or the like, and more particularly as a displacement element utilizing a displacement due to an inverse piezoelectric effect or an electrostrictive effect, and the element can also be used as a passive element of an acceleration sensor element, an impact sensor element, or the like.

FIG. 1 shows a schematic perspective view of an embodiment of a device 1 according to a first aspect of the present invention. The device 1 comprises a driving portion 3 which is driven by a displacement of a piezoelectric element 2, a movable portion 4 which is operated based on driving of the driving portion 3, and a fixing portion 5 which holds the driving portion 3 and the movable portion 4. The driving portion 3 is a pair of thin plates facing each other, and comprises a film-like piezoelectric/electrostrictive element 2 formed on an outer surface of at least one thin plate of the thin plates, the fixing portion 5 is coupled with the movable portion 4 via the driving portion 3, and a hole is defined by an inner wall of the driving portion 3, an inner wall of the movable portion 4, and an inner wall of the fixing portion 5, and the device 1 is so structured that a ratio a/b of the thickness a of the piezoelectric/electrostrictive device, namely a distance in the X-axis direction in FIG. 1, and the width b of the piezoelectric/electrostrictive device is 0.5 to 20, and a ratio e/a of the maximum length e of a length of a hole 8 of the longitudinal direction of the piezoelectric/ electro-strictive device, namely the length in parallel with the Z-axis direction in FIG. 1, and the thickness a of the piezoelectric/electrostrictive device is 0.5 to 10. The ratio a/b is preferably 1 to 10, and more preferably 2 to 8, and the ratio e/a is preferably 0.7 to 5. By structuring in this way, a flapped or swung displacement in the Y-axis direction, or a vibration can be suppressed and a large displacement superior in high-speed response can be resultantly obtained at a low voltage. Here, the maximum length is, as described hereinafter, the largest length of a length in parallel with the Z-axis of the hole 8 including a part of the hole 8, when the part of the hole 8 is extended over to a part of the movable portion 4.

The length f of the movable portion 4 shown in FIG. 1 is preferably short. With shorter f, the movable portion 4 can be made lighter in weight and a resonance frequency can be increased. However, in order to secure stiffness of the movable portion 4 in the X-axis direction, and to ensure a displacement thereof, the ratio f/d relative to the thickness d of the above-mentioned thin plate is to be 3 or more, and preferably 10 or more. It is needless to say that the thickness c of the hole 8 is naturally determined if the thickness a of the device and the thickness d of the thin plate 6 are determined. Meantime, the actual dimension of f is determined by paying due consideration to a bonding area for attaching components to the movable portion 4, a bonding area for attaching the fixing portion 5 to other members, a bonding area for attaching electrode terminals or the like, mechanical strength and durability of the device as a whole, and the like. Normally, the value of a is preferably 100 $\mu$m to 2000 $\mu$m, and more preferably 200 $\mu$m to 1000 $\mu$m. Normally, the value of b is preferably 100 $\mu$m to 2000 $\mu$m, and more preferably 100 $\mu$m to 500 $\mu$m. As described above, the value of c is naturally determined if the value of a and the value of d are determined. Normally, the value of d is preferably 2 $\mu$m to 100 $\mu$m, and more preferably 4 $\mu$m to 50 $\mu$m. Normally, the value of e is preferably 300 $\mu$m to 3000 $\mu$m, and more preferably 500 $\mu$m to 2000 $\mu$m. The value of f is preferably 50 $\mu$m to 2000 $\mu$m, and more preferably 100 $\mu$m to 1000 $\mu$m. By structuring the device in this way, when an operating voltage, normally around 30 V, is applied, the displacement in the Y-axis direction does not normally exceed 10% of the displacement in the X-axis, or main axis, direction, but this can be adjusted to 5% or less by suitably adjusting within the above-mentioned preferable range, which is an extremely superior advantage. In otherwords, a substantially dominant displacement is obtained for one axis of the X-axis, which is the main axis.

Figure 3:
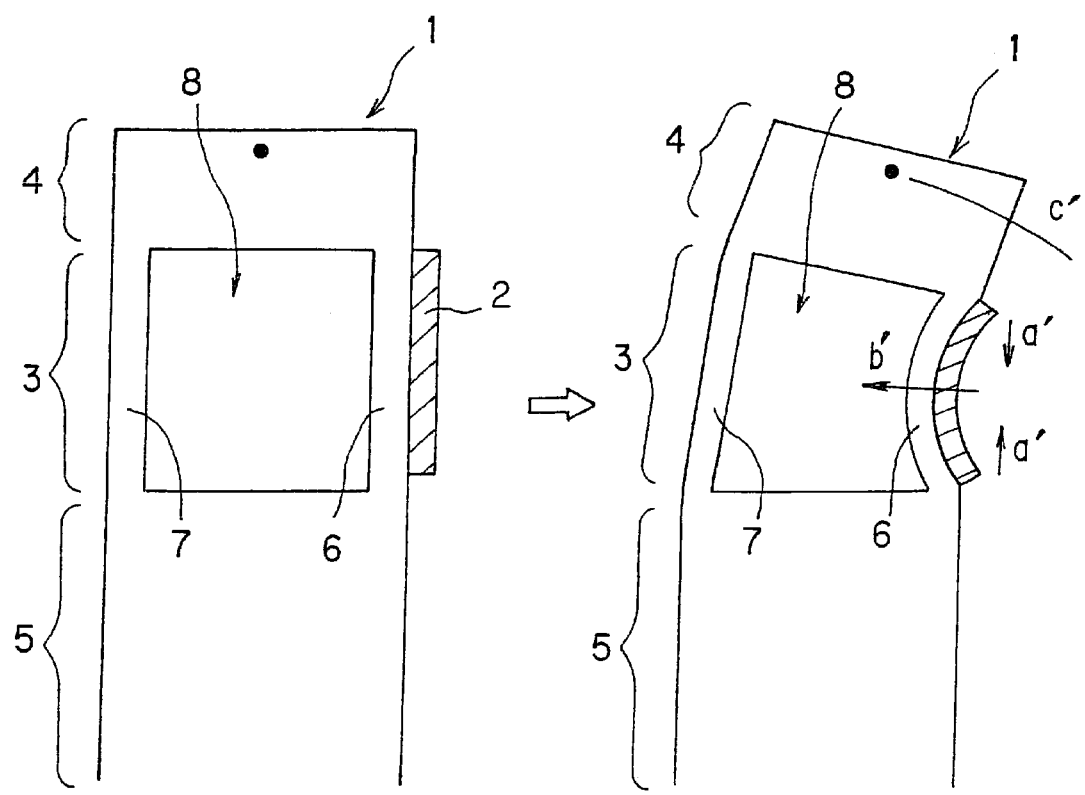
FIG. 3 shows a schematic explanatory view of an operational mode of a piezoelectric/electrostrictive device of the present invention.

The driving direction of the driving portion 3 is schematically shown in FIG. 3. In FIG. 3, a case is shown where the device 1 has the piezoelectric element 2 formed on the surface of one of the pair of the thin plate 6, 7 and in this case, the driving portion drives in a direction orthogonally crossing the displacement direction of the piezoelectric element which is shown by a symbol a' in FIG. 3, namely in a direction shown by a symbol b'. In other words, since a infinitesimal displacement in expansion-contraction direction of the piezoelectric element 2 is firstly amplified into a larger drive utilizing bending of the thin plate 6, and then transmitted to the movable portion 4, the movable portion 4 can be operated in a large magnitude as shown by a symbol c'.

Figure 2:
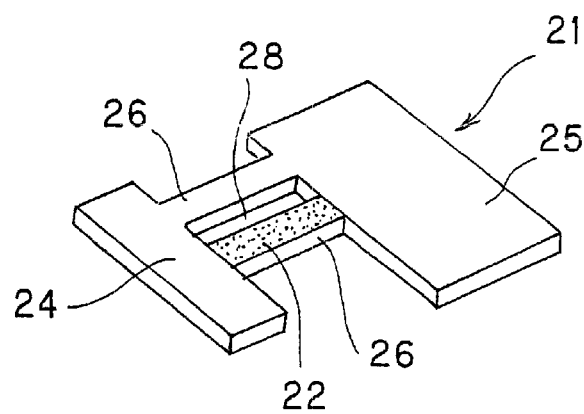
FIG. 2 shows a schematic perspective view of an embodiment of a conventional piezoelectric actuator.

Meantime, in the device 1, since the shape of the device is not a board-like body as shown in FIG. 2, but the movable portion 4 and the fixing portion 5 are in rectangular solid form, and the thin plates 6 and 7 are spanned so that the side surfaces of the movable portion 4 and the fixing portion 5 are continuous, the stiffness of the device in the Y-axis direction can be selectively raised. In other words, in the device 1, an arc-shaped operation of the movable portion 4 within a plane including the driving direction of the driving portion 3, namely within the XZ plane, can be selectively generated, and an operation within the YZ plane of the movable portion 4, or an operation in the so-called flapped direction can be suppressed.

Figure 4:
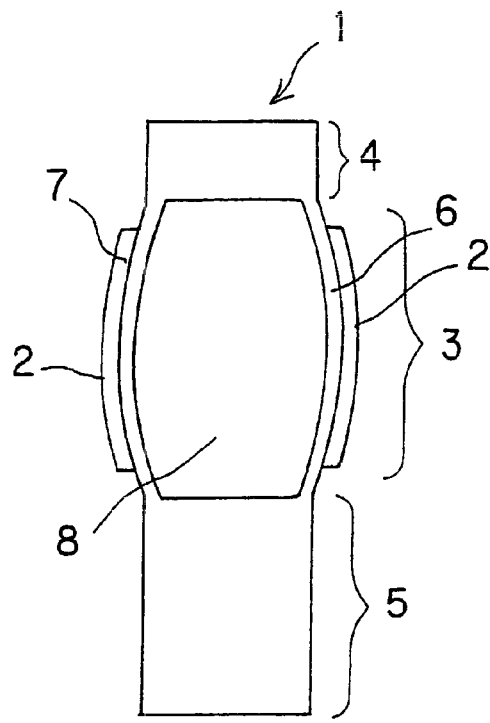
FIG. 4 shows a schematic perspective view of another embodiment of a piezoelectric/electrostrictive device of the present invention.
Figure 5:
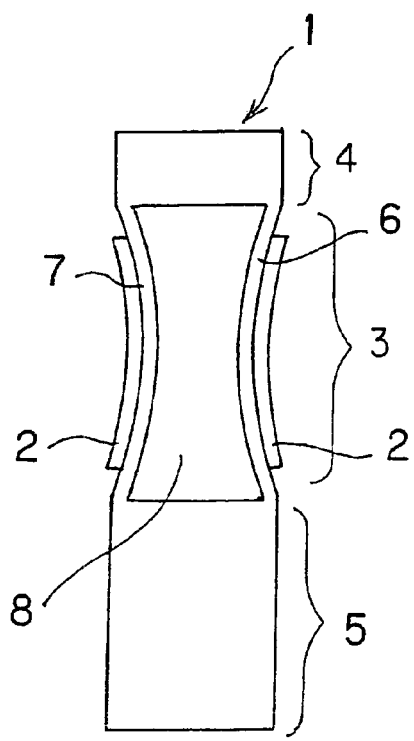
FIG. 5 shows a schematic perspective view of still another embodiment of a piezoelectric/electrostrictive device of the present invention.

The shape of a hole 8 defined by an inner wall of the driving portion 3, an inner wall of the movable portion 4, and an inner wall of the fixing portion 5 can be optional as long as the operation of the driving portion is not hampered. For example, the shape may have a curvature symmetrically swollen outward in the centers as shown in FIG. 5, or a curvature symmetrically depressed inward in the centers as shown in FIG. 4. In both shapes, since the device is bent in the displacement direction, a desired displacement can be obtained at a relatively low voltage.

Figure 6:
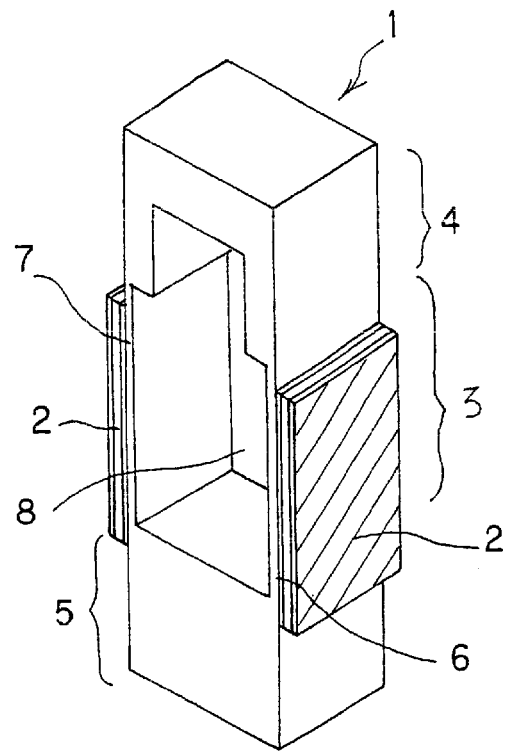
FIG. 6 shows a schematic perspective view of still another embodiment of a piezoelectric/electrostrictive device of the present invention.
Figure 7:
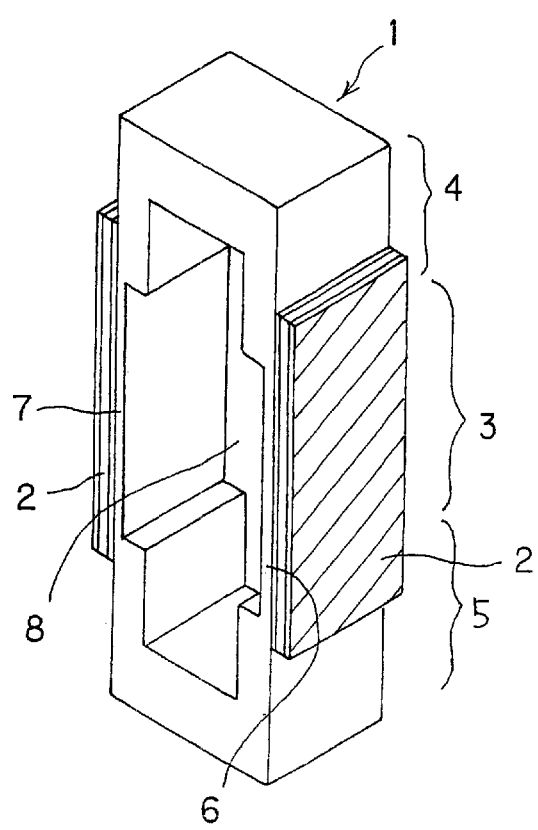
FIG. 7 shows a schematic explanatory view of still another embodiment of a piezoelectric/electrostrictive device of the present invention.
Figure 8:
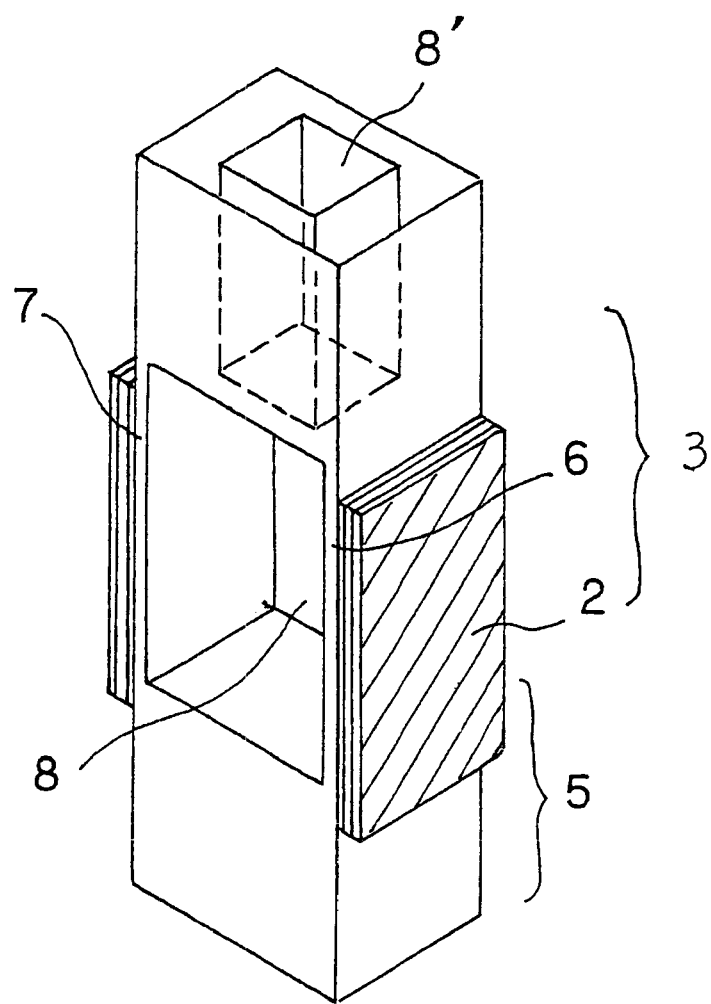
FIG. 8 shows a schematic explanatory view of still another embodiment of the piezoelectric/electrostrictive device of the present invention.

The hole 8 may be formed with a part thereof encroaching into a part of the movable portion 4, as shown in FIG. 6, or may be formed with a part thereof encroaching into a part of the fixing portion 5 as well as the movable portion 4, as shown in FIG. 7. Parts of the hole 8 formed in the movable portion 4 and the fixing portion 5 are not necessarily to be mutually similar or the same, and the shapes may be deter-mined depending on the application modes or the like of the device. As a matter of course, the shape of the hole to be formed inside the movable portion 4 and/or the fixing portion 5 is not required to be in rectangular solid form or cube form, and can be optionally selected from known shapes depending on the modes of application or the like thereof. In any of the above-mentioned cases, the volume of the movable portion 4 and/or the fixing portion 5 can be reduced. Consequently, an advantage can be achieved that the reduced weight favors the increase of the resonance frequency As shown in FIG. 8, a through-hole 8' may be formed in a part of the movable portion 4 in a shape communicated with the hole 8. Although not depicted in Fig, the through-hole 8' may be formed in a part of the fixing portion 5, in a shape corresponded to FIG. 7, in the same way as in the movable portion 4 in a shape communicated with the hole 8. Of course, the through-hole 8' may be formed in a part of the fixing portion 5, instead of the movable portion 4, in a shape communicated with the hole 8, although not depicted in Fig. The through-holes 8' formed in the movable portion 4 and the fixing portion 5 are not required to be mutually similar or the same in shape, and the shapes may be determined depending on the modes of application or the like of the device. As a matter of course, the throughhole 8' formed in the movable portion 4 and/or the fixing portion 5 is not required to be in rectangular solid form or cube form, and it goes without saying that the shapes thereof can be optionally selected from known shapes depending on the modes of application or the like thereof.

Now described is a piezoelectric/electrostrictive device comprising a driving portion to be driven by a displacement of a piezoelectric/electrostrictive element, a movable portion to be operated based on driving of the driving portion, and a fixing portion for holding the driving portion and the movable portion, wherein the driving portion is formed of a pair of thin plates facing each other and a film-like piezoelectric/electrostrictive element formed on at least a part of an outer surface of at least one thin plate of the thin plates and having a width same as the width of the thin plate and/or a length which exceeds the length of the thin plate portion constituting the driving portion, and reaches to at least a part of the movable portion, the fixing portion is coupled with the movable portion via the driving portion, and a hole is defined by an inner wall of the driving portion, an inner wall of the movable portion, and an inner wall of the fixing portion.

Figure 9:
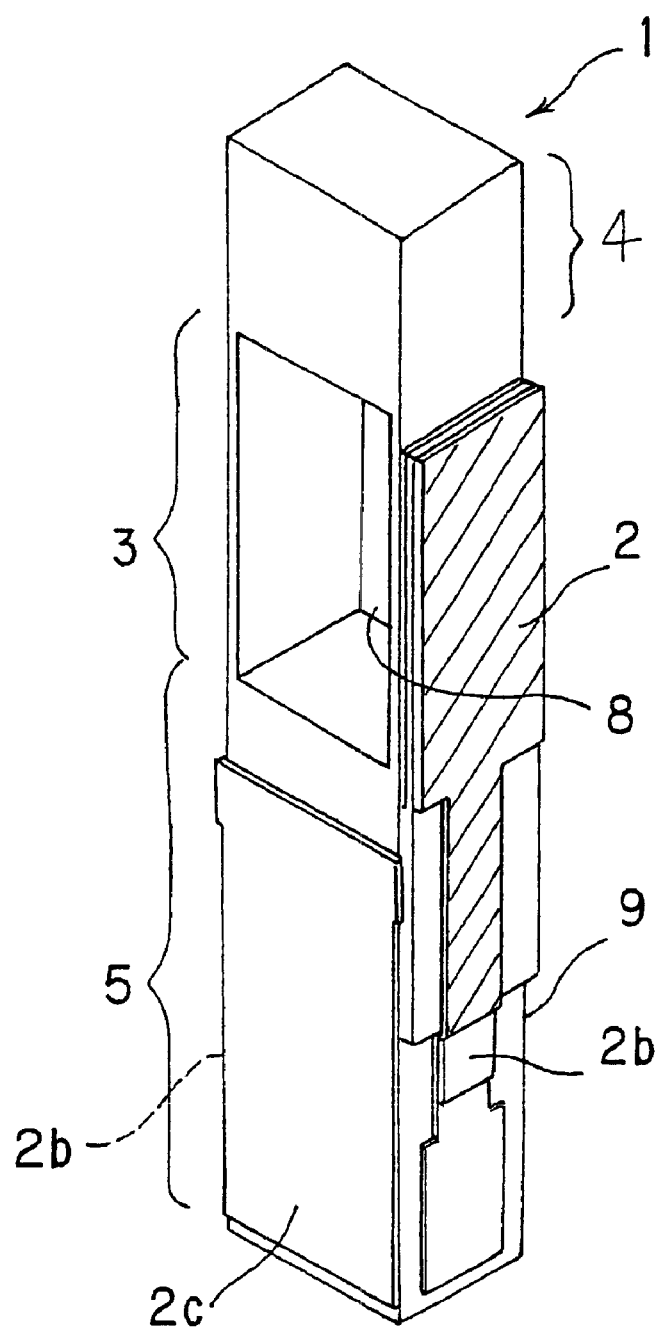
FIG. 9 shows a schematic explanatory view of still another embodiment of a piezoelectric/electrostrictive device of the present invention.
Figure 10:
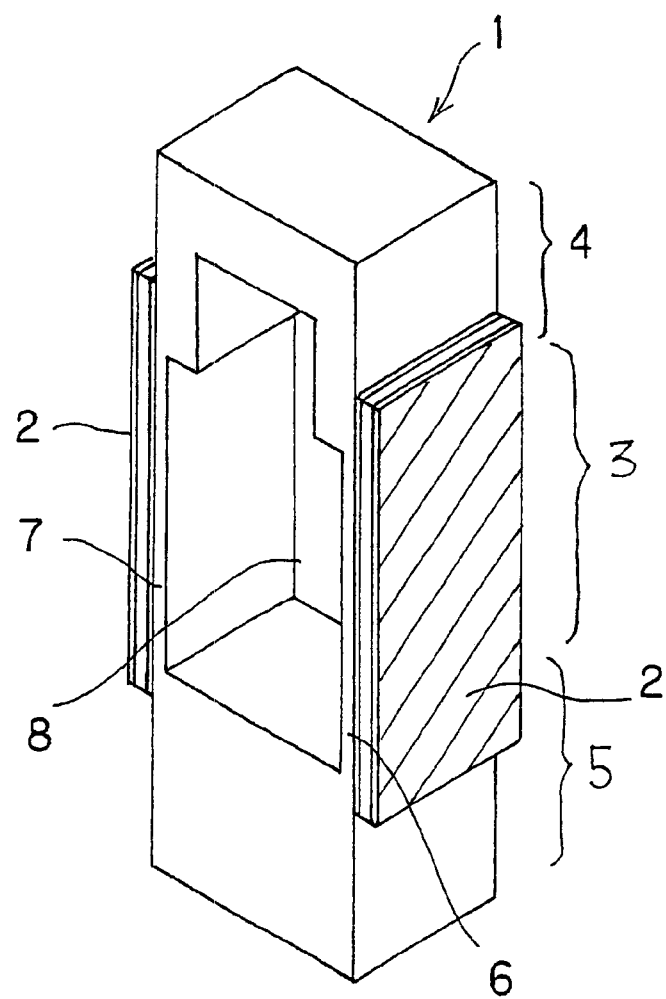
FIG. 10 shows a schematic explanatory view of still another embodiment of a piezoelectric/electrostrictive device of the present invention.

Now, description is made about an embodiment where a piezoelectric/electrostrictive element formed on at least a part of an outer surface of at least one thin plate of the thin plates has a width the same as the width of the thin plate, as shown in FIG. 9. When the piezoelectric/electrostrictive element has a width the same as the width of the thin plate, as shown in FIG. 9 and FIG. 10, a generating force of the driving portion is increased, thus favorably acting on raising a displacement. In this case, a device may be implemented with a piezoelectric element 2 formed respectively on both of the pair of the thin plates, with two lower electrodes 2c of the piezoelectric element 2 which are made to be commonly used, and is drawn out from the side of the fixing portion 5 on one surface where the hole 8 is apertured, and with an upper electrode 2b which is directly drawn out to the side of the fixing portion 5 of the surface where the piezoelectric elements 2 are formed. In this embodiment, since a part of the side of the fixing portion 5 on the other surface where the hole 8 is apertured, namely at numeral 9 in FIG. 9, has no electrode formed thereon, and the part can be utilized for securing the device, the device can be reliably secured, favorably serving for compaction or the like, which is another advantage. Further, FIG. 10 shows an embodiment of a through-hole 8' formed in a part of the movable portion 4, as shown in above-mentioned FIG. 8, in a shape communicated with the hole 8, where the length of the piezoelectric/electrostrictive element is extended to a part of the through-hole 8' by use of an element which is longer in the Z-axis direction. In this embodiment, an advantage is displayed by the formation of the through-hole 8' and another advantage is displayed by the elongation in the Z-axis direction of the length of the piezoelectric/electrostrictive element, which are preferable. Of course, the similar structure is utilized in FIG. 1, FIG. 6, FIG. 7, and FIG. 8. In FIG. 9, however, although an element is formed to the vicinity of the movable portion 4, from an displacement mechanism standpoint of the device according to the present structure, it is preferable to form an element at a position of length extending 65% to 75% of the length of the thin plate portion, i.e., hole part length, since a large displacement may be obtained.

Figure 11:
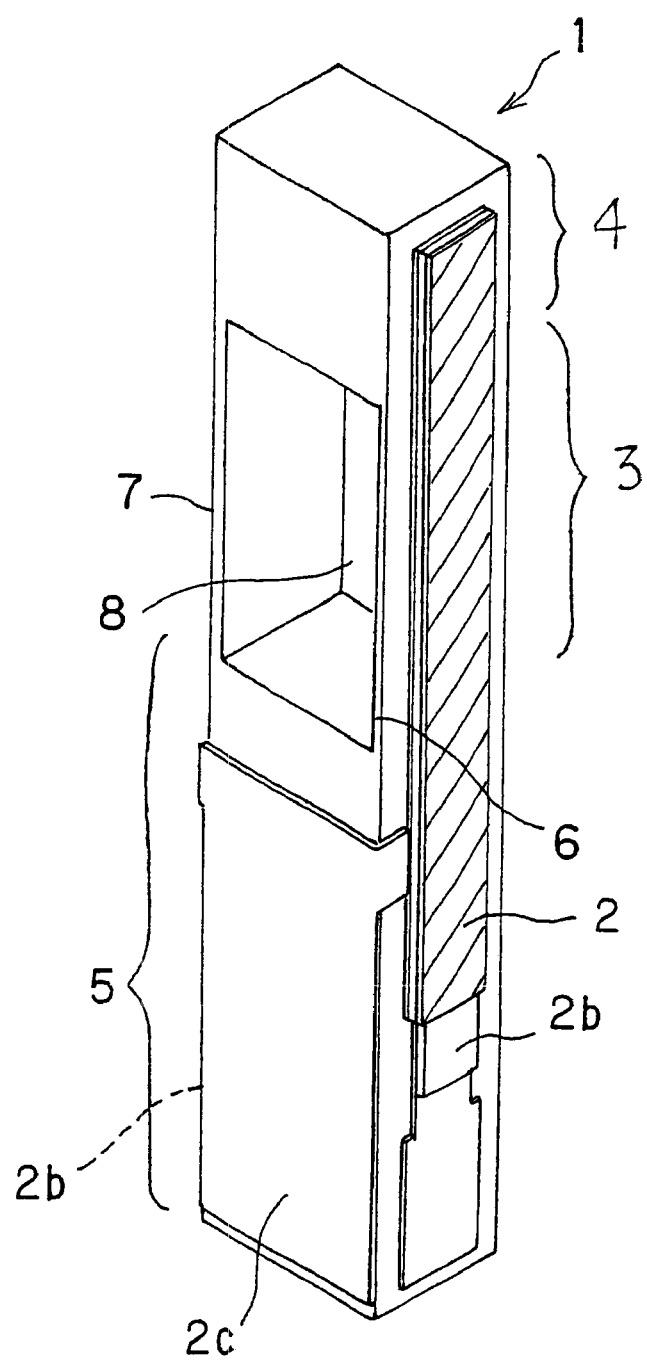
FIG. 11 shows a schematic explanatory view of still another embodiment of a piezoelectric/electrostrictive device of the present invention.

Now, description is made about an embodiment, as shown in FIG. 11, where a piezoelectric/electrostrictive element has a length which exceeds the length of the thin plate portion constituting the driving portion and reaches at least to a part of the movable portion. When using this structure, the mechanical strength of the bonding portion between the movable portion and the thin plate is reinforced and a resonance frequency is also raised. As the other structure is similar to the device shown in above-described FIG. 9, description about the other structure is omitted. Although, in FIG. 11, lengths of a lower electrode, a piezoelectric film, and an upper electrode in a piezoelectric element are the same, the lengths do not necessarily have to be the same, and from the displacement mechanism stand-point of the device according to the present structure, it is preferable that at least the upper electrode is made shorter than the piezoelectric film and the lower electrode is around 50% of the thin plate portion length, i.e., hole part length. It is preferable to have this sort of electrode structure, since a large displacement is obtained while securing the mechanical strength of the bonding portion between the thin plate and the movable portion.

Figure 12:
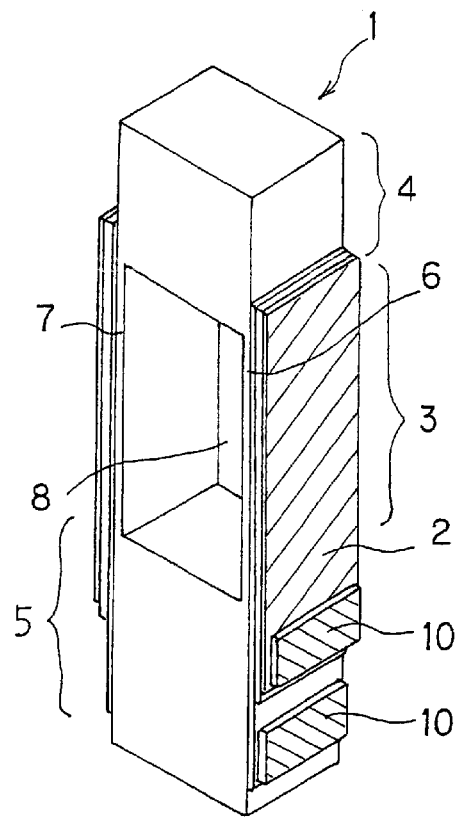
FIG. 12 shows a schematic explanatory view of still another embodiment of a piezoelectric/electrostrictive device of the present invention.
Figure 13:
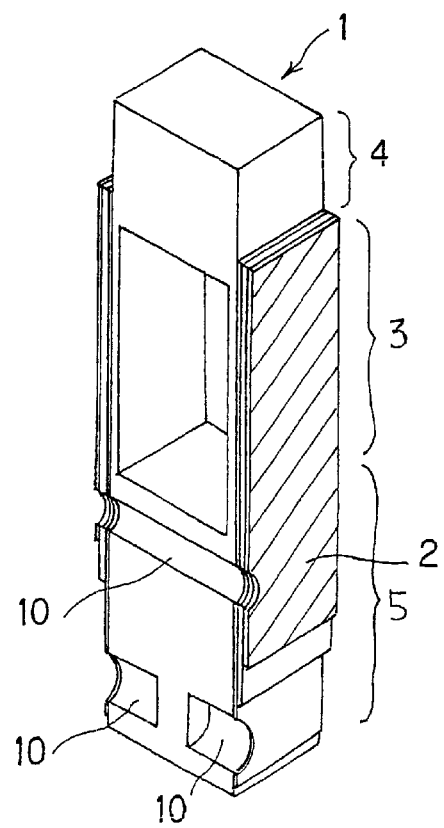
FIG. 13 shows a schematic explanatory view of still another embodiment of a piezoelectric/electrostrictive device of the present invention.

Now, arrangement of driving signal applying terminals 10 shown in FIG. 12 and FIG. 13 is described. FIG. 12 shows an example in which the driving signal applying terminals 10 are arranged on the side face of the fixing portion 5. According to this structure, the device can be secured independently of the surface where the terminals are arranged, thus high reliability can be obtained in securing the device and bonding between circuits and terminals. In this embodiment, the terminals and the circuits are bonded by way of a flexible printed circuit (also called FPC), a flexible flat cable (also called FFC), wire bonding or the like. FIG. 13 shows the driving signal applying terminals 10 arranged on a surface orthogonally crossing the surface having the piezoelectric/electrostrictive element arranged thereon. If the surface with the driving signal applying terminals formed thereon is utilized as a fixing surface, there is an advantage that the connection of the driving signal applying terminals 10 and the circuits (not depicted) and the securing of the device per se can be simultaneously performed. In this embodiment, a through-hole is previously provided in the fixing portion 5, the through-hole is filled with a conductive material, then piezoelectric/electrostrictive element patterns are respectively bonded, the filled surface of the through-hole is exposed by machining, and the surface is utilized as the driving signal applying terminals 10. Instead of a conductive material, a conductor wire may be embedded. In this example, the through-hole provided in the vicinity of the hole 8 may be used as a common terminal.

Figure 14:
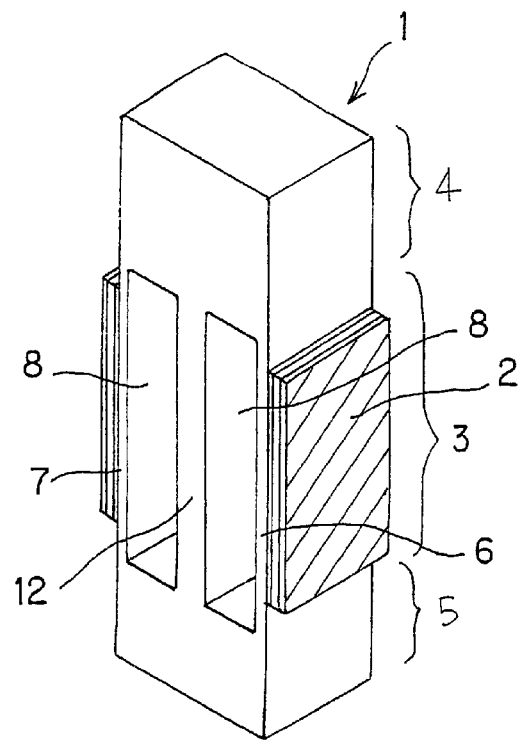
FIG. 14 shows a schematic explanatory view of still another embodiment of a piezoelectric/electrostrictive device of the present invention.
Figure 15:
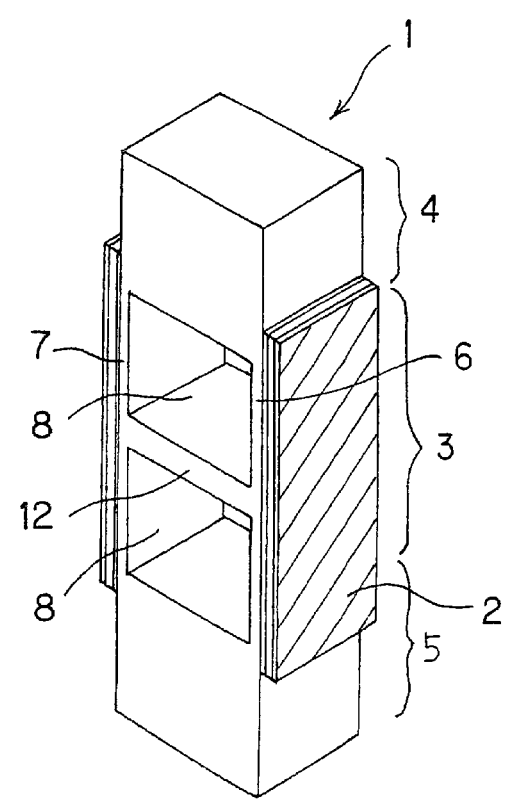
FIG. 15 shows a schematic explanatory view of still another embodiment of a piezoelectric/electrostrictive device of the present invention.
Figure 16:
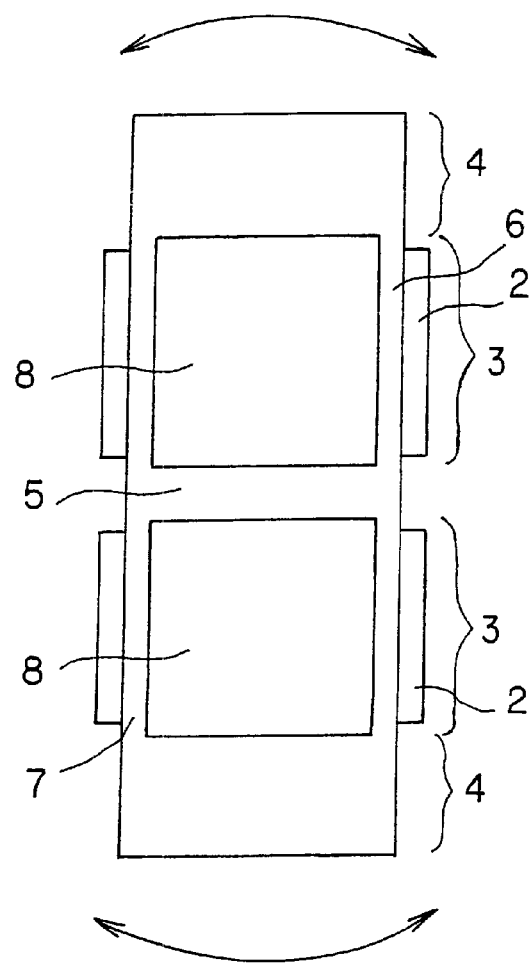
FIG. 16 shows a schematic explanatory view of still another embodiment of a piezoelectric/electrostrictive device of the present invention.
Figure 29:
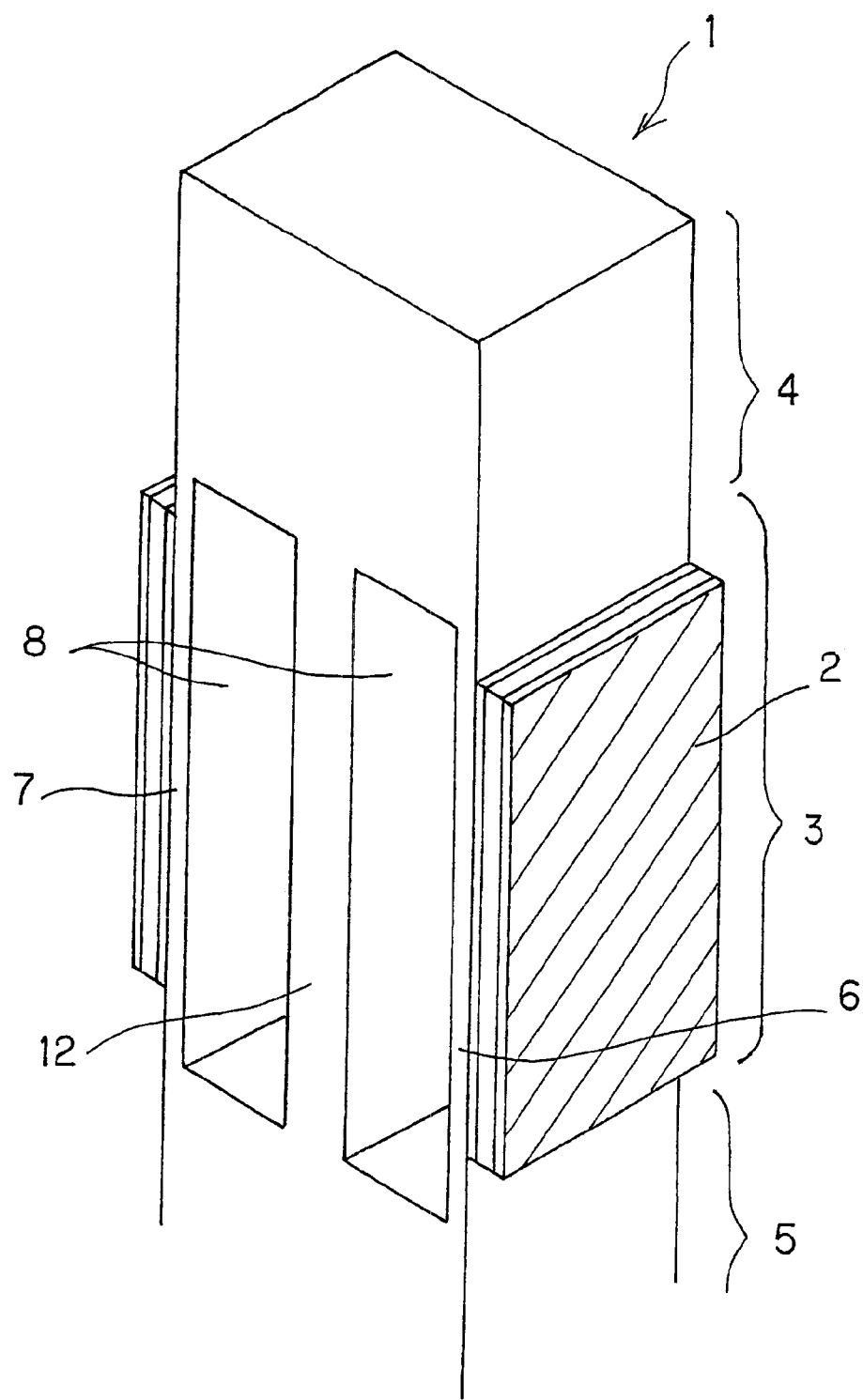
FIG. 29 shows a schematic explanatory view of still another embodiment of a piezoelectric/electrostrictive device of the present invention.

Now, an embodiment with a beam bridge formed in the hole 8 is described. FIG. 14 and FIG. 29 respectively show examples of a beam bridge 12 formed in parallel with the Z-axis direction, and FIG. 15 shows an example of a beam bridge 12 formed perpendicularly in the Z-axis direction. In embodiments shown in FIG. 14 and FIG. 29, stiffness of the device can be raised without substantially reducing a displacement, with a resultantly raised resonance frequency, which is an advantage. The difference between the examples shown in FIG. 14 and FIG. 29 is only that the arrangement method for the piezoelectric/electrostrictive element is different. In the embodiment shown in FIG. 15, stiffness of the device can be raised, and as the result, the resonance frequency can be advantageously raised. FIG. 16 shows an example of a beam bridge 12 formed perpendicularly in the Z-axis direction as shown in FIG. 15, with an addition of two each of the piezoelectric/electrostrictive elements arranged sandwiching respective holes 8.

In the above-described embodiment, by individually controlling a plurality of the piezoelectric elements 2, and by differentiating displacement quantities, an operation can be easily obtained where an arc-shaped operation within the XZ plane and an expanding-contracting operation in the Z-axis direction are synthesized. The embodiment shown in FIG. 16 shows a structure which is preferable to the application for such uses as sensing by means of independently performing displacement operations of the upper unit 4 and the lower unit 4 of the piezoelectric/electrostrictive device in FIG. 16.

Furthermore, it is possible to use one of two piezoelectric elements 32 as a driving element, and the other as a vibration detecting element. In other words, by using the driving portion of the device for detecting the displacement of the movable portion, a piezoelectric/electrostrictive device according to the present invention can function as an acceleration sensor or an impact sensor, thus detection of anomalies of the driving element is made possible, and if a voltage to be applied to the driving element is controlled based on a signal from the detecting element, more precise control of operation quantity is made possible. Further, firstly by detecting a vibration of the portion per se where the piezoelectric/electrostrictive device is provided, and then by giving an operation of opposite phase to the movable portion so as to cancel the detected vibration, the relative vibration of the movable portion can be suppressed, which is another advantage.

Further, a piezoelectric element is not necessarily formed on each of thin plates, and the element may be divided into a plurality of elements as required. For example, though not depicted, when the element is divided in the Y-axis direction, a displacement can be controlled by each individual piezoelectric element, thus the displacement in the YZ plane (so-called flapped component) can be suppressed. On the other hand, when the element is divided in the Z-axis direction, the element becomes liable to be bent at the dividing part, thus an operational quantity of the movable portion is increased and the resolution of the operational quantity can be improved. When a piezoelectric element is divided, one of the divided piezoelectric elements can be made as a driving element, and the other as a detecting element, thus realizing a compact structure and detection and control in higher accuracy.

When a piezoelectric element of each thin plates is divided as described above, though not depicted, it is preferable to provide a slit between the divided piezoelectric elements. By structuring in this way, since a thin plate is liable to bend at the slit, an individual piezoelectric element becomes liable to bend, and as the result, the displacement of the piezoelectric element can be efficiently transmitted to the movable portion, which is another advantage.

Of course, when there are two or more driving portions, the movable portion and the fixing portion are not required to be at both ends of the device, and in the embodiment shown in FIG. 16, the fixing portions are positioned at the both ends and the movable portion 4 may be arranged between the fixing portions 5—5.

In such structure, although an operational quantity of the movable portion is reduced, mechanical strength and impact resistance can be improved since the device 1 can be assuredly secured, and the operation within the YZ plane (so-called the operation in flapped direction) can be suppressed, which is still another advantage.

When a plurality of driving portions are provided as the case described above, though not depicted, it is preferable that each of the gaps between each of the driving portions are structured with a shorter distance compared with the gaps in the fixing portion and the movable portion. The reason is that, with this structure, an operational quantity can be increased.

Furthermore, a length of each driving portions may be structured so that the length becomes shorter toward the movable portion. In such structure, since delicate control of the driving quantity becomes possible at the short driving portion while maintaining a driving quantity at the long driving portion, it is preferable in that the movable portion can be operated in a large magnitude, and delicate adjustment becomes possible. Moreover, although balance with the mechanical strength is to be considered, it is preferable that the device has a notch formed between each of the driving portions, though not depicted. At the notch, the thin plate becomes liable to bend, thus the operational quantity of the movable portion can be increased. A device according to the present invention has a further advantage, in addition to those described above, that suitable composing materials can be selected for members other than a piezoelectric/electrostrictive element in accordance with required features of each of members, since it is not necessary to use piezoelectric/electrostrictive materials in structuring whole of the device, which is still another advantage. In other words, by composing other members than the piezoelectric/electrostrictive element with materials of lighter weight, the device can be made less subjected to harmful vibrations, and in the similar way, mechanical strength, handling property, impact resistance, and humidity resistance of the device can be easily improved.

Further, since a filler is not required, displacement efficiency may not be reduced due to an inverse piezoelectric effect or an electrostrictive effect.

2. Components of Device

Now, though partially overlapping the above-described items, each members composing a device according to the present invention is individually described in detail by an example of the device shown in FIG. 1.

(1) Movable Portion and Fixing Portion

A movable portion 4 is a portion which is operated based on a driving quantity of a driving portion 3, and to which a variety of members are attached depending on application purposes of the device 1. For example, when the device 1 is used as a displacement element, a member requiring position adjustment such as a shield of an optical shutter, a magnetic head or the like may be attached.

A fixing portion 5 is a portion for holding the driving portion 3 and the movable portion 4, and by holding and securing the fixing portion 5 to any basic body, the device as a whole is secured.

Further, an electrode lead or other members for controlling a piezoelectric element 2 may also be arranged. As materials for composing the movable portion 4 and the fixing portion 5, although any materials may be used without any specific limitation as long as stiffness is held, it is preferable to use ceramics to which green sheet laminating method to be described later can be applied. Particularly, zirconia such as fully-stabilized zirconia, partially stabilized zirconia or the like, alumina, magnesia, silicon nitrate, or the like may be used, and in view of high mechanical strength and toughness, zirconia, particularly fully-stabilized zirconia and partially-stabilized zirconia are preferable.

(2) Driving Portion

The driving portion 3 is a portion which is driven in accordance with a displacement of the piezoelectric element 2, and comprises thin plates 6 and 7 facing each other, and a film-like piezoelectric element 2 formed on the surface of the thin plates 6, 7.

① Thin Plate

The thin plates 6 and 7 are flexible thin plate-like members, and have a function of amplifying an expansion-contraction displacement of the piezoelectric element 2 provided on the surface thereof into a deflection displacement to transmit to the movable portion 4.

Consequently, the thin plates can be formed of any materials having flexibility and mechanical strength enough to resist breakage due to deflecting deformation, and the materials can be suitably selected paying due consideration to the response property and operability of the movable portion.

Normally, thickness of the thin plates 6 and 7 is preferably around 2 $\mu$m to 100 $\mu$m, and combined thickness of the thin plates 6 and 7 and the piezoelectric element 2 is preferably 7 $\mu$m to 500 $\mu$m. The width of the thin plates 6 and 7 is preferably 100 $\mu$m to 2000 $\mu$m.

As materials for composing the thin plates 6 and 7, ceramics may be preferably used in a similar way as with the movable portion 4 and the fixing portion 5, and zirconia, particularly fully-stabilized zirconia and partially-stabilized zirconia, is most preferably used because of a large magnitude of mechanical strength in thin plate form, high toughness, and small reactional property. Of above-mentioned fully-stabilized and partially-stabilized zirconia, zirconia is preferably stabilized as to be described hereinafter. Namely, of compounds for stabilizing zirconia, compounds such as yttrium oxide, ytterbium oxide, cerium oxide, calcium oxide, and magnesium oxide may be used, and although zirconia is partially or fully stabilized by adding and including at least one of the above-mentioned compounds, zirconia can be stabilized for desired purpose not only by adding one kind of the compounds but also by adding combination of the compounds.

Of the quantity to be added of the respective compounds, in case of yttrium oxide and ytterbium oxide, it is 1 to 30 mol %, and preferably 1.5 to 10 mol %, of cerium oxide, 6 to 50 mol % and preferably 8 to 20 mol %, and of calcium oxide and magnesium oxide, 5 to 40 mol % and preferably 5 to 20 mol %. Of all these compounds, particularly yttrium oxide can be preferably used as the stabilizer, and in the case, adding quantity may be 1.5 to 10 mol %, and more preferably 2 to 4 mol %.

Further, in order to obtain above-mentioned mechanical strength and stabilized crystal phase, it is desirable that the average crystal grain size of zirconia is 0.05 to 3 $\mu$m, and preferably 1 $\mu$m or less.

② Piezoelectric Element

Figure 17:
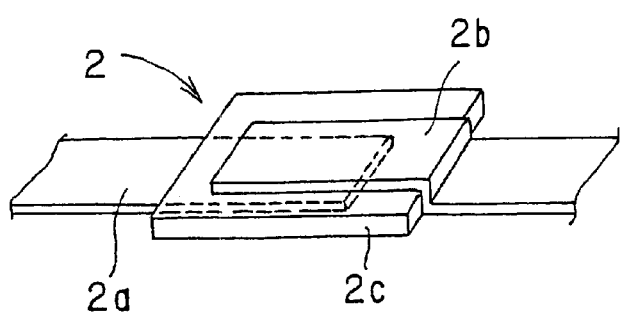
FIG. 17 shows a schematic perspective view of an embodiment of a piezoelectric element constituting a piezoelectric/electrostrictive device of the present invention.

A piezoelectric element 2 comprises a piezoelectric film, and electrodes for applying a voltage to the piezoelectric film, and a conventional known piezoelectric element such as unimorph-type, bimorph-type or the like may be used. For example, as shown in FIG. 17, a laminated type piezoelectric element 2 which is formed by laminating a lower electrode 2a, a piezoelectric film 2c, and an upper electrode 2b, or the like may be preferably used.

Figure 18:
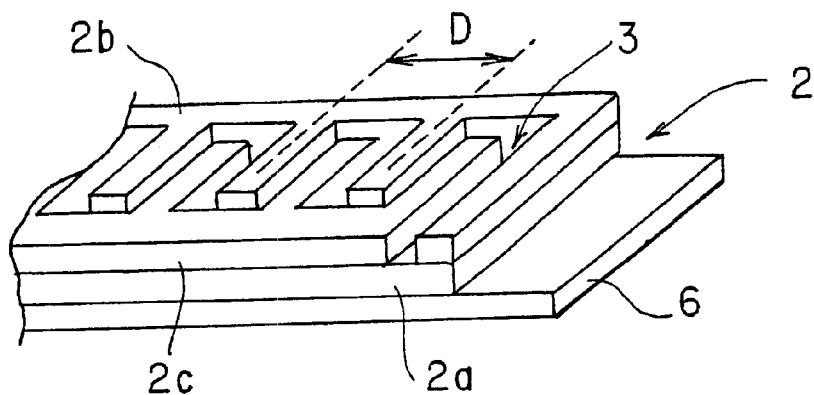
FIG. 18 shows a schematic perspective view of another embodiment of a piezoelectric element constituting a piezoelectric/elecrostrictive device of the present invention.
Figure 19:
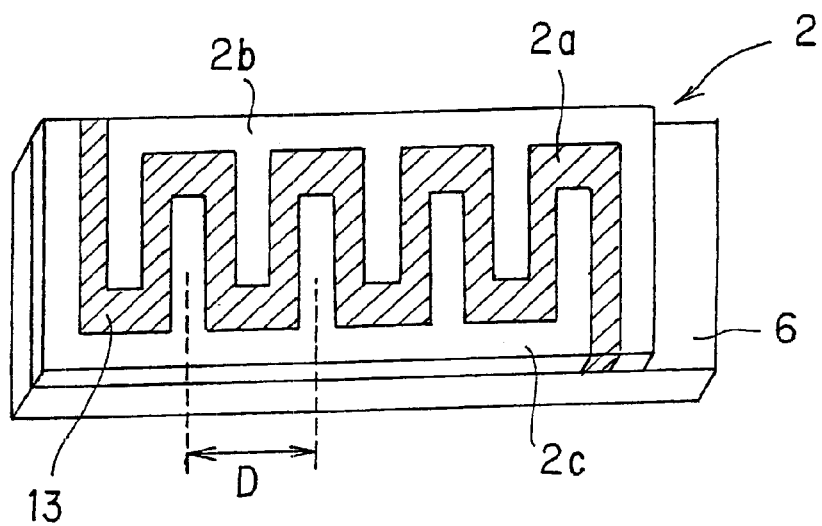
FIG. 19 shows still another embodiment of a piezoelectric element constituting a piezoelectric/elecrostrictive device of the present invention.

Further, the piezoelectric element 2, as shown in FIG. 18, comprising a first electrode 2b and a second electrode 2c, both having comb-type structure, and having a structure in which the first electrode 2b and the second electrode 2c are alternately opposed with a gap 13 of predetermined width between each tooth of respective combs, may be used. In FIG. 18, although the first electrode 2b and the second electrode 2c are arranged on the upper surface of the thin plate 6 and the piezoelectric film 2a, the electrodes may be formed between the thin plate 6 and the piezoelectric film 2a. Further, a piezoelectric element 2 as shown in FIG. 19 also comprises a first electrode 2b and a second electrode 2c, both having comb-type structure, and is structured so that the first electrode 2b and the second electrode 2c are alternately opposed with a gap 13 of predetermine width between each tooth of respective combs. Although the piezoelectric element 2 is composed so as to embed the piezoelectric film 2a in the gap 13 between the first electrode 2b and the second electrode 2c, such piezoelectric element may also be preferably used in the device according to the present invention. When a piezoelectric element having comb-type electrodes such as a piezoelectric element shown in the above-mentioned FIG. 18 and FIG. 19 is used, a displacement of the piezoelectric element can be increased by reducing the pitch D between each tooth of respective combs.

Although the piezoelectric element 2, like the device 1 shown in FIG. 1, is formed preferably on an outer surface of the device 1 from a viewpoint that the driving portion can be driven in a larger magnitude, the piezoelectric element 2 may be formed inside the device 1, namely in the hole, and may also be formed on both inside and outside of the device 1. As a piezoelectric film, although piezoelectric ceramics are preferably used, electrostrictive ceramics, ferroelectric cermics, or antiferroelectric ceramics can also be used. However, when using these ceramics for a magnetic head or the like, since linearity between an operation quantity of the movable portion and a driving voltage or an output voltage is important, it is preferable to use materials having small hysteresis of strain, and the materials having coercive electric field of 10 kV/mm or less is preferred.

Particular piezoelectric ceramics that may be used for the purpose is ceramics containing lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, strontium bismuth tantalate, or the like, singly or as a mixture. Particularly, in view that higher electromechanical coupling factor and piezoelectric constant are obtainable, reactive property against the thin plate, i.e., ceramics, at sintering of a piezoelectric film is small, and stabilized composition is obtainable, a material containing lead zirconate, lead titanate, and lead magnesium niobate as a major component, or a material containing sodium bismuth titanate as a major component may be preferably used.

Further, for the above-mentioned piezoelectric ceramics, oxides of lanthanum, calcium, strontium, molybdenum, tungsten, barium, niobium, zinc, nickel, manganese, cerium, cadmium, chromium, cobalt, antimony, iron, yttrium, tantalum, lithium, bismuth, tin, or the like may be used singly or as mixed ceramics. For example, when lanthanum or strontium is included in a mixture of lead zirconate, lead titanate and lead magnesium niobate which are major components, an advantage may be obtained that the coercive electric field and piezoelectric characteristics or the like may be made adjustable.

It is p referable that the electrodes of the piezoelectric element are a solid body at room temperature, and are composed of a highly conductive metal, and a metal such as, for example, aluminum, titanium, chromium, iron, cobalt, nickel, copper, zinc, niobium, molybdenum, ruthenium, palladium, rhodium, silver, tin, tantalum, tungsten, iridium, platinum, gold, lead, or the like is used singly or as an alloy of any of these metals. Further, a cermet made by dispersing the same materials of a piezoelectric film and/or a thin plate may also be used for the purpose.

Selection of the materials for the electrodes in the piezoelectric element is determined depending on a forming method of the piezoelectric film. For example, when a first electrode is firstly formed on a thin plate and then a piezoelectric film is formed on the first electrode by sintering, it is necessary to use a metal having a high melting point such as platinum or the like that is not changed at a sintering temperature. However, because a second electrode to be formed on a piezoelectric film after the piezoelectric film is formed can be formed at a lower temperature, it is possible to use a metal having a lower melting point such as aluminum or the like.

Although a variety of modes are conceivable for an electrode lead from a piezoelectric element, as the modes shown in FIG. 9 or FIG. 11, in a device having piezoelectric elements 2 formed on both plates 6 and 7 facing each other thereof, a lower electrode 2c of the two piezoelectric elements is made as a common electrode, and drawn out to the side of the fixing portion 5 of one surface where the hole 8 is open, and the upper electrode 2b is directly drawn to the side of the fixing portion 5 on the surface where the piezoelectric elements 2 are formed. Since such modes have no electrode formed on a part, numeral 9 in FIG. 9, of the side of the fixing portion 5 on the other surface where the hole 8 is open, and the part can be used for securing the device, the device can be reliably secured, thus preferably enabling compaction of the device and the like.

Figure 20A:
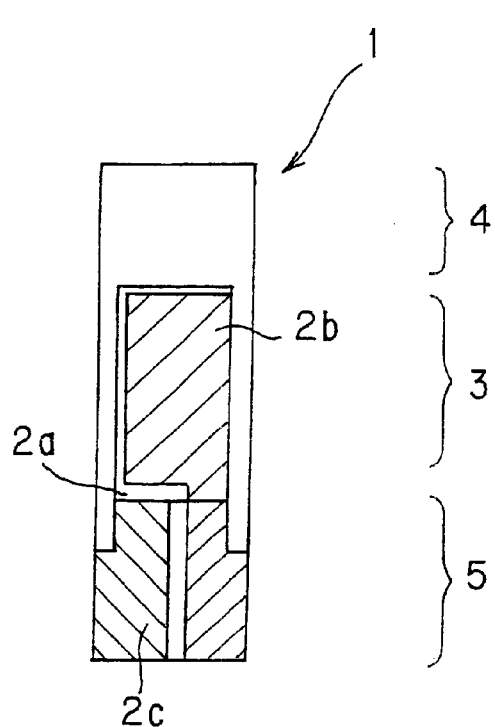
FIGS. 20(*a*) and (*b*) show schematic explanatory views of another embodiment of an electrode lead arrangement method of a piezoelectric/electrostrictive device of the present invention.
Figure 20B:
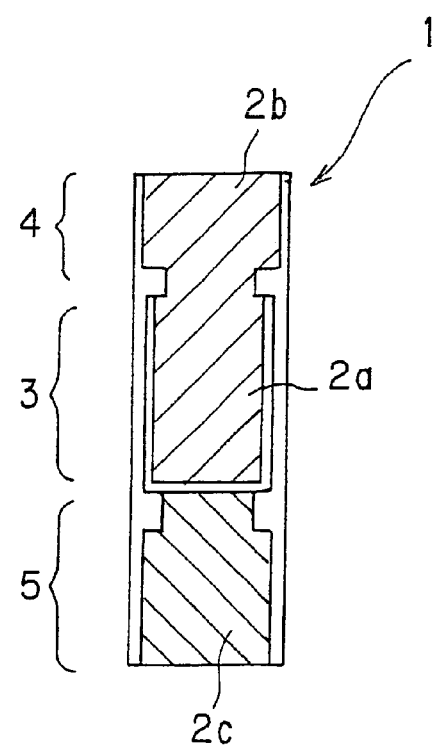

As alternative embodiments, as shown in FIG. 20(a), both the upper electrode 2b and the lower electrode 2c may be drawn so as to be in parallel with the side of the fixing portion 5 on the surface where the piezoelectric elements 2 are formed, or as shown in FIG. 20(b), both the upper electrode 2b and the lower electrode 2c may be separately drawn to the side of the movable portion 4 and the side of the fixing portion 5 of the surface where the piezoelectric elements 2 are formed.

3. Fabricating Method of Device

Here, fabricating methods of a device according to the present invention are described.

It is preferable that, for a device according to the present invention, composing materials of each members are ceramics, and the device is fabricated by means of the green sheet lamination method. According to the green sheet lamination method capable of integrally forming the device, reliability of bonded portions of each member can be improved, and by simplification of the fabricating process, the device having superior characteristics as above described can be mass-produced.

(1) Fabrication of Laminated Body

Firstly, a slurry is prepared by adding and mixing a binder, a solvent, a dispersant, and the like to a ceramic power such as zirconia or the like, then the slurry is degassed, and then the slurry is used for forming a green sheet having a predetermined thickness by the reverse roll coater method, the doctor blade method, or the like.

Figure 21A:
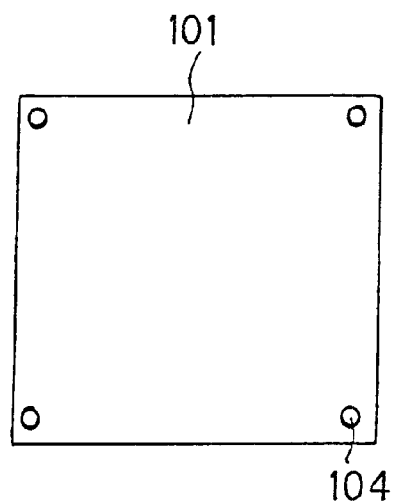
FIGS. 21(*a*) and (*b*) show schematic explanatory views of examples of green sheets to be used in fabricating a piezoelectric/electrostrictive device of the present invention.
Figure 21B:
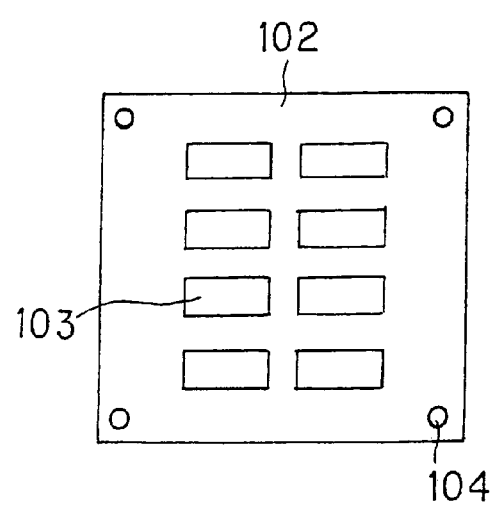

Then, the green sheet is processed into various shapes as shown in FIG. 21 by a method such as punching with a die(punching), or the like.

A green sheet 101 schematically represents a green sheet which mainly becomes a thin plate after being sintered, and a green sheet 102 with at least one rectangular hole 103 formed thereon schematically represents a green sheet which is used for members constituting the movable portion and the fixing portion. In the green sheet 102, by forming holes 103 so as to be parallel in one or more rows, a plurality of devices can be obtained at a time, or at least one device having a plurality of movable portions can be obtained. By use of at least one green sheet constituting the thin plate and at least one green sheet with at least one hole formed thereon, prepared beforehand, a green-sheet laminated body comprising green sheets constituting a pair of thin plates and a series of green sheets each with at least one hole formed thereon may be prepared by, for example, laminating the at least one green sheet constituting the thin plate with at least one green sheet with at least one hole formed thereon. As a matter of course, there is no limitation on the preparing method of a green-sheet laminated body; in other words, on a laminating sequence of a green sheet including the green sheet constituting at least a thin plate and a green sheet with at least one hole formed thereon, and normally lamination is possible at an optional sequence as long as the laminated body gives any inconvenience to processing steps to follow.

That is, a first case is that the green sheet constituting at least the thin plate uses a green sheet laminated by at least one green sheet with at least one hole formed thereon for the green sheet constituting the thin plate, a second case is that the green sheet constituting at least the thin plate comprises only the green sheet constituting the thin plate, and the green sheet with at least one hole formed thereon uses a green sheet laminated by a desired number of green sheets each with at least one hole formed thereon, a third case is that at least one green sheet with at least one hole formed thereon uses a green sheet laminated by at least one green sheet constituting a thin plate, and a fourth case is with the green-sheet laminated body where a green sheet at least constituting the thin plate comprises only a green sheet constituting the thin plate, and the green sheet with at least one hole formed thereon is laminated with a desired number of green sheets each with at least one hole formed thereon, and the like.

Figure 28A:
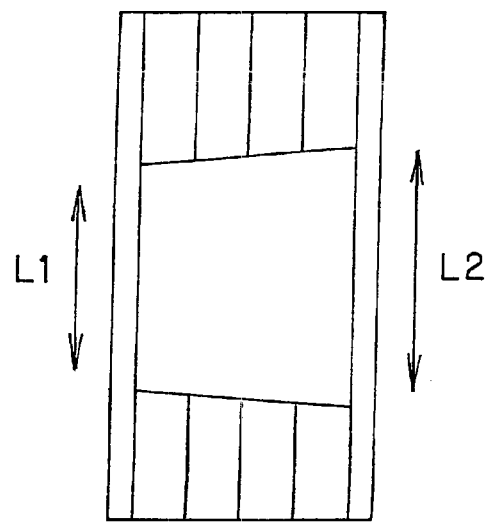
FIGS. 28(*a*) and (*b*) show a schematic view of an embodiment of a fabricating method of a piezoelectric/electrostrictive device of the present invention, and FIG. 28(*a*) shows a schematic sectional view of a case where a green sheet with at least one hole formed thereon mounted on a plastic film is not used.
FIG. 28(b) shows a schematic sectional view of a case where a green sheet with at least one hole formed thereon mounted on a plastic film is fabricated by laminating on the outer-most layer of a laminated green-sheet body with at least one hole formed thereon.
Figure 28B:
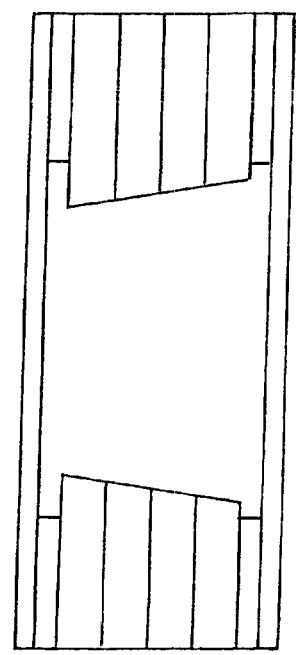

Further, when laminating at least a plurality of the green sheets each with at least one hole formed thereon, it is preferable that a green sheet with at least one hole formed thereon is formed on a plastic film, the green sheet formed on the plastic film and with at least one hole formed thereon is laminated on a surface to be the outermost layer of the green-sheet laminated body with at least the one hole formed thereon, and after the hole is accurately aligned, the plastic film is removed, thus machining precision and laminating precision of the device can be improved, which is preferable. This means, when a hole is defined by laminating thick sheets, as shown in FIG. 28(a), difference in dimensions between L1 and L2 is liable to occur due to shift of position by deformation of the sheet at laminating, contraction of the green sheet, lowered machining precision, difference in dimension precision accompanied by machining when a thick green sheet is used, or the like. However, if a green sheet mounted on a plastic film and with at least one hole formed thereon is used as the surface to be the outermost layer of a green-sheet laminated body with at least one hole formed thereon, not only the deformation of the green sheet at the time of handling can be substantially avoided, but also both surfaces to be the outermost layers can be made in the same shape, as shown in FIG. 28(b), thus the hole can be accurately aligned and machining precision and laminating precision can be improved. Meantime, a green sheet mounted on the plastic film and with at least one hole formed thereon includes not only a green sheet prepared by punching with a die and by laser-beam processing of a green sheet on the plastic film, but also a green sheet prepared by pasting a plastic film on a green sheet with at least one hole, formed beforehand in a desired shape, formed thereon. Further, it is preferable that the plastic film is a poly(ethylene terephthalate) film in view of exfoliation, mechanical strength, or the like.

Figure 22:
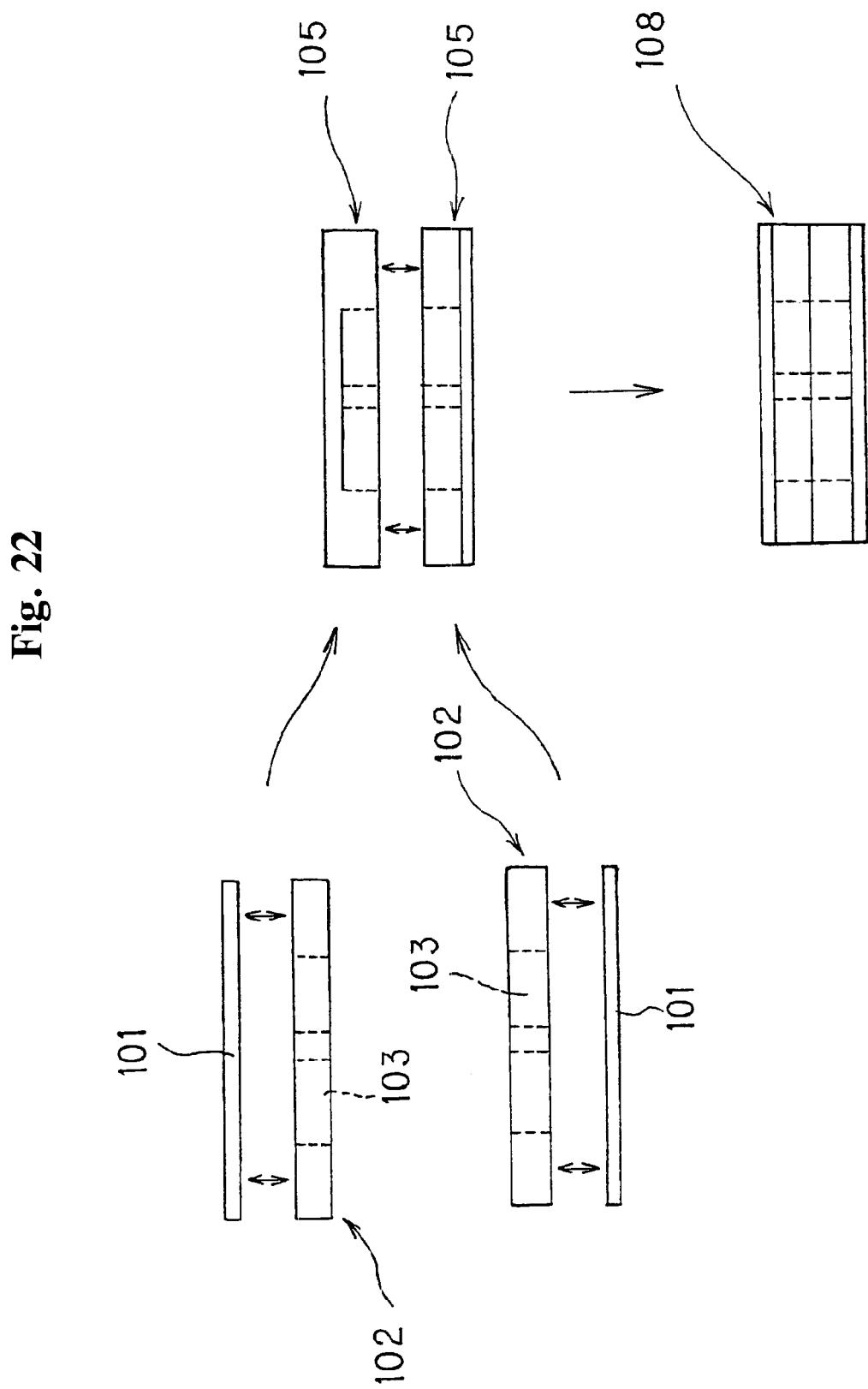
FIG. 22 shows side views of an embodiment of a fabricating method of a piezoelectric/electrostrictive device of the present invention.
Figure 23A:
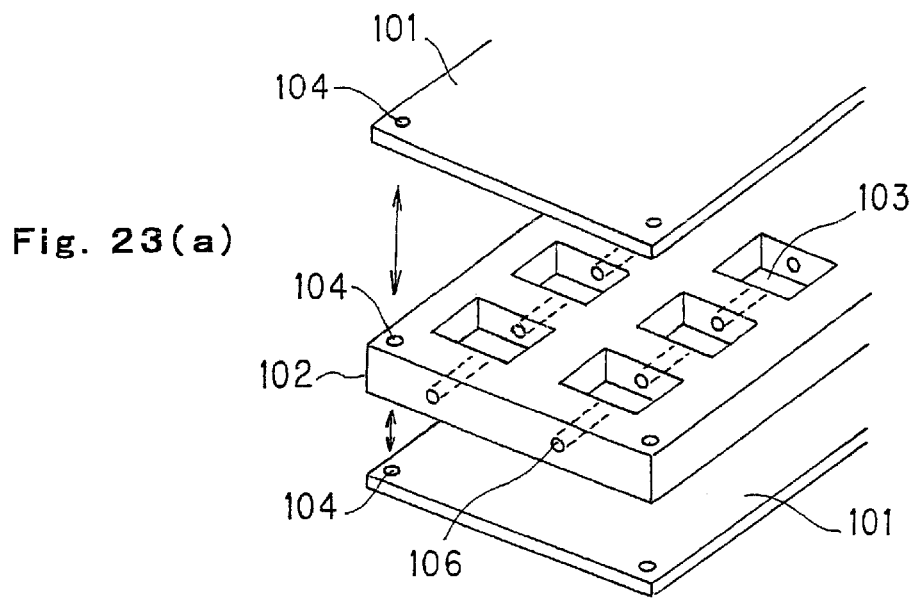
FIGS. 23(*a*), (*b*), (*c*), and (*d*) show process views of an embodiment of a fabricating method of a piezoelectric/electrostrictive device of the present invention.

An example of a fabricating method related to the present invention is described. As shown in FIG. 23(a), a green-sheet laminated body can be obtained by laminating, while aligning a position, in the order of a green sheet 101 constituting a thin plate, a green sheet 102 which is the green sheet laminated by desired number of green sheets each with at least one hole formed thereon, and a green sheet 101 constituting the thin plate, by means of a reference hole 104, and by integrating the green sheets thus made by thermo-compression bonding or the like. When a thickness of the laminated body formed by the green sheet 102 is too thick, a laminated body 105 having a thickness halved into upper and lower portions as shown in FIG. 22 is first formed, and the two portions are bonded so that holes 103 face each other, thus a laminated body 108 may be obtained. Further, when fabricating a structure having a hollow as a structure shown in FIG. 8, if the green sheets are laminated in the order and then a green-sheet laminated body is integrated by thermo-compression bonding or the like, there may be regions where a force is not exerted, thus lamination reliability may be lowered. In such case, it is preferable that green sheets to be laminated are selected so that the laminating pressure prevails at all regions, and the green sheets are laminated and integrated into components, and afterward a group of the components are further laminated and integrated into a green-sheet laminated body of the final shape.

Meanwhile, of the laminated body 108, it is necessary to have a communicating hole 106 communicating a part to be a hole 103 on the green sheet 102 with the outside space, formed on the green sheet 102, or the communicating hole 106 is to be bored after the laminated body is made. In this case, however, as long as respective holes 103 are communicated with the outside space, the shape of the communicating hole 106 is not specifically limited, and a plurality of holes 103 may be penetrated all through as shown in FIGS. 23(a) and (b), or the holes 103 may individually communicate with the outside space as shown in FIG. 23(d).

(2) Formation of Piezoelectric/electrostrictive Element

Figure 23B:
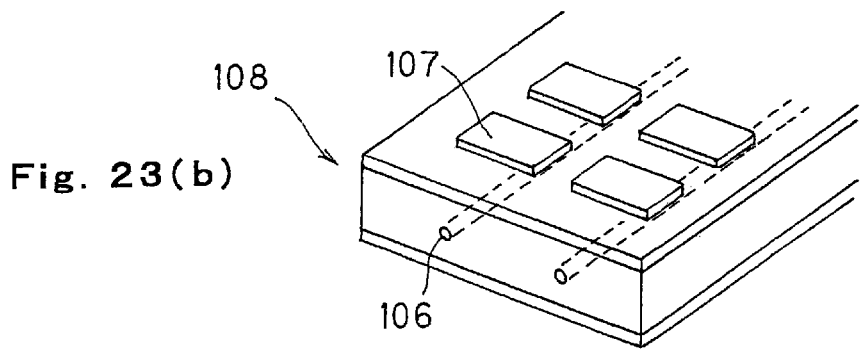

In the fabricating method of the present invention, a piezoelectric element 107 can be formed on the surface of a sintered sheet 101 constituting a thin plate by thick-film forming method such as screen printing method, dipping method, coating method, electrophoresis method or the like or thin-film forming method, such as ion beam method, sputtering method, vacuum evaporation, ion plating method, chemical vapor deposition method (CVD), plating, or the like (FIG. 23(b)). By forming a piezoelectric element by film-forming methods in this way, the piezoelectric element and a thin plate can be integrally bonded and arranged without using an adhesive, thus reliability and reproducibility can be secured and integration is made easy. However, in the fabricating method of the present invention, it is preferable that a piezoelectric element 7 is formed by thick-film forming methods. The reason is that, according to these methods, a piezoelectric film can be formed of a paste, a slurry, a suspension, an emulsion, or a sol, or the like, of which the major component is piezoelectric ceramic particle of average particle size of 0.01 to 5 $\mu$m, and preferably 0.05 to 3 $\mu$m, and improved piezoelectric operation characteristics can be obtained. Particularly, the electrophoretic method has an advantage that a film can be formed in high density and high shape precision.

Particularly, a laminated body 108 is sintered at a predetermined condition, preferably at a temperature of 1200° C. to 1600° C., then a lower electrode is printed and sintered at the predetermined position of the surface of the sintered green sheet 101, then a piezoelectric film is printed and sintered, and further an upper electrode is printed and sintered, thus a piezoelectric element can be formed (FIG. 23(b)). Further, an electrode lead for connecting an electrode with a driving circuit is printed and sintered. Here, if materials for respective members are selected so as to have a sequentially lowering sintering temperature like platinum (Pt) for the lower electrode, lead zirconate titanate (PZT) for the piezoelectric film, gold (Au) for the upper electrode, and silver (Ag) for the electrode lead, once-sintered material is, at any sintering stage, never re-sinteredand occurrence of such troubles as exfoliation and aggregation of electrode members can be avoided.

Moreover, by selecting proper materials, each members of a piezoelectric element 107 and an electrode lead can be printed in succession, and integrated sintering at one time is made possible, while the electrodes or the like can be provided at a lower temperature after the piezoelectric film is formed. Further, each member of the piezoelectric element and an electrode lead may be formed without trouble by thin-film forming methods such as sputtering method, vacuum evaporation, or the like, and in this case, heat treatment is not necessarily required. Furthermore, it is preferable that a piezoelectric element 107 is formed beforehand at a position on a green sheet 101 finally constituting a thin plate, so that the piezoelectric element 107 is simultaneously sintered with a green-sheet laminated body 108. As methods for simultaneous sintering of a piezoelectric element 107 and a green-sheet laminated body 108, there is illustratively given a method that a piezoelectric film is formed by a press forming method using a die, or tape-forming method using slurry materials, or the like, the piezoelectric film still to be sintered is laminated on a green sheet 101 by the thermo-compression bonding, and simultaneously sintered to produce a movable portion, a driving portion, thin plates, and a piezoelectric film at the same time. In this method, however, it is necessary to form an electrode on thin plates or a piezoelectric film beforehand by use of already described film-forming methods.

Sintering temperature for a piezoelectric film is suitably determined depending on composing materials of the film, and the temperature is generally 800° C. to 1400° C., and preferably 1000° C. to 1400° C. In this case, in order to control composition of the piezoelectric film, it is preferable to sinter under the presence of evaporation source of the materials of the piezoelectric film. When simultaneously sintering a piezoelectric film and a green sheet laminated body, sintering conditions of the both are to be united.

Further, when fabricating a device with a piezoelectric film formed respectively on a pair of thin plates facing each other, piezoelectric films, electrodes, and the like may be printed on both surfaces of a laminated body. In a case like this, it is necessary to take a measure so that the printed piezoelectric films, electrodes, and the like are prevented from being attached to a printing stage ① by printing on the printing stage having a concave provided thereon, or ② by first forming a frame-like convex in the surrounding of a printing position on at least one printing surface of the laminated body, and then the surface where the convex is formed is printed, followed by printing of the other surface, or the like.

(3) Cutting of Laminated Body

Figure 23C:
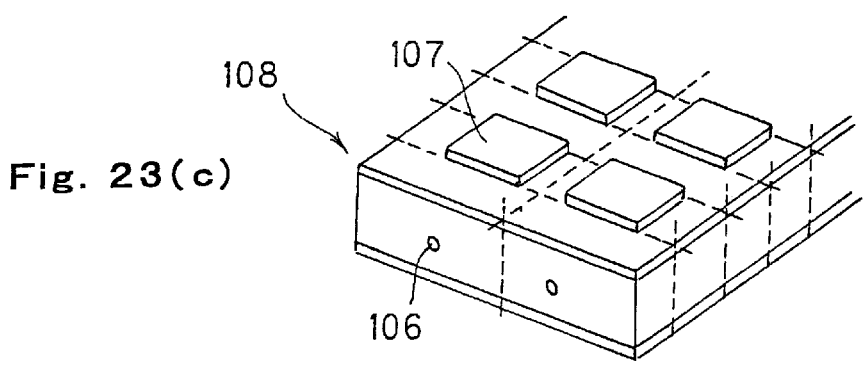
Figure 23D:
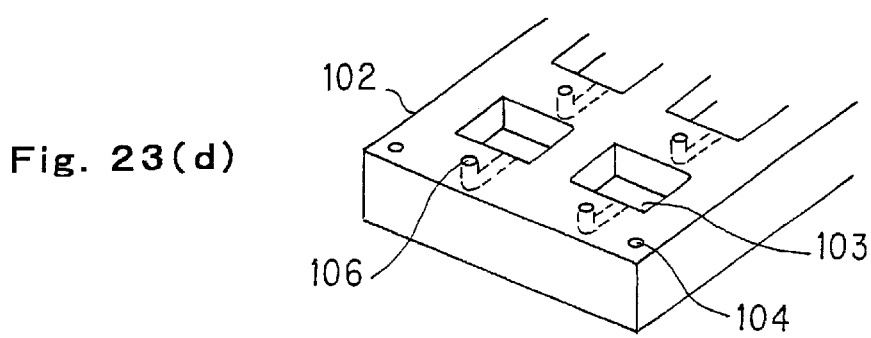

A sintered body of a laminated body with above-described piezoelectric elements formed thereon is formed of a notch depending on necessity, and subjected to processing of coating, shielding, or the like with regard to a piezoelectric element and an electrode lead, if necessary, then cut in the laminating direction of the green sheet so that the rectangular hole 103 is open on the side face of the laminated body, thus a plurality of devices are simultaneously fabricated (FIG. 23(c)). As the methods for cutting, in addition to the dicing machining, wire-saw machining or the like (mechanical machining), the laser-beam machining by YAG laser, eximer laser, or the like, and electron-beam machining can be applied.

Figure 24A:
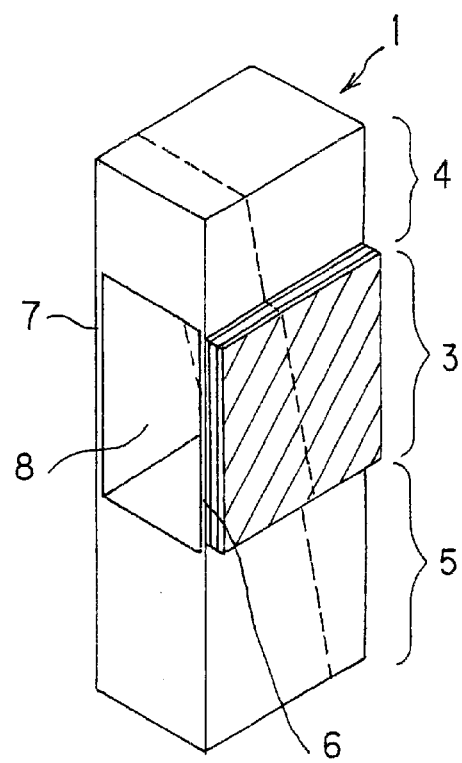
FIGS. 24(*a*) and (*b*) show side views of another embodiment of a fabricating method of a piezoelectric/electrostrictive device of the present invention, and FIG. 24(*a*) shows a side view of a cutting position, and FIG. 24(*b*) a side view of a device after being cut.
Figure 24B:
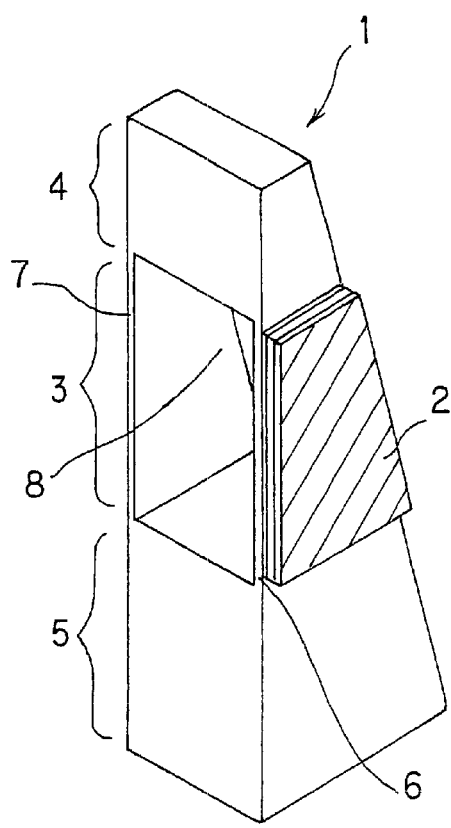

In the fabricating method according to the present invention, a laminated body is cut so that a hole of desired shape, for example, a rectangular hole 103, is open on a side face of the laminated body. Such cutting has an advantage that not only a plurality of devices are separated but also thin plates and a hole, for example in case of the device of FIG. 1, the thin plates 6 and 7 and the hole 8, are simultaneously formed, and is preferable in that a structure, which is complicated and hard to fabricate since two or more rectangular solid forms are coupled by a thin plate, can be obtained with ease. Instead, a laminated body may be cut into two at a section indicated by dotted lines in FIG. 24(a) to fabricate devices. By cutting in this way, the weight of a movable portion is made lighter and as the result it is advantageous for a higher resonance frequency. Further, stiffness in the X-axis direction and the Y-axis direction can be secured on the wide portion of the driving portion 3, thus the laminated body is also strong against impacts from both directions. According to this fabricating method, two devices can be fabricated from one device, thus productivity can be improved. Meanwhile, in FIG. 24(a), although other surfaces of the device in parallel with the Z-axis are perpendicular to the base, the surfaces may have a structure having an inclination similar to that of the opposing surface.

Further, by appropriately changing the number of formations and the position of formations of the holes 103 on the green sheet 102, or cutting position of the laminated body 108, a device having a plurality of driving portions or a device having different lengths of driving portions can be fabricated with extreme ease.

Furthermore, a device according to the present invention may be fabricated by means of the pressure forming method, casting method, injection molding method, or the like using a forming die, in addition to the above-described fabricating methods using a green sheet. Although fabrication of a laminated body is also possible by bonding each composing members prepared as separate bodies, there are problems also of reliability that bonded portions are liable to be damaged or the like, in addition to low productivity.

4. Application Example of Device

As an example of application of a device according to the present invention, description is made about an example where the device according to the present invention is applied to a displacement element of an optical shutter. An "optical shutter" in the present specification means a functional element for controlling transmission and shielding of the light by relatively moving two shields, and the optical shutter, being capable of performing ON/OFF control of the light and control of quantity of the light, can function as an optical switch and an optical diaphragm.

In the optical shutter of the present invention, at least one shield of the two shields is mounted on the movable portion of the device of the present invention.

Figure 25A:
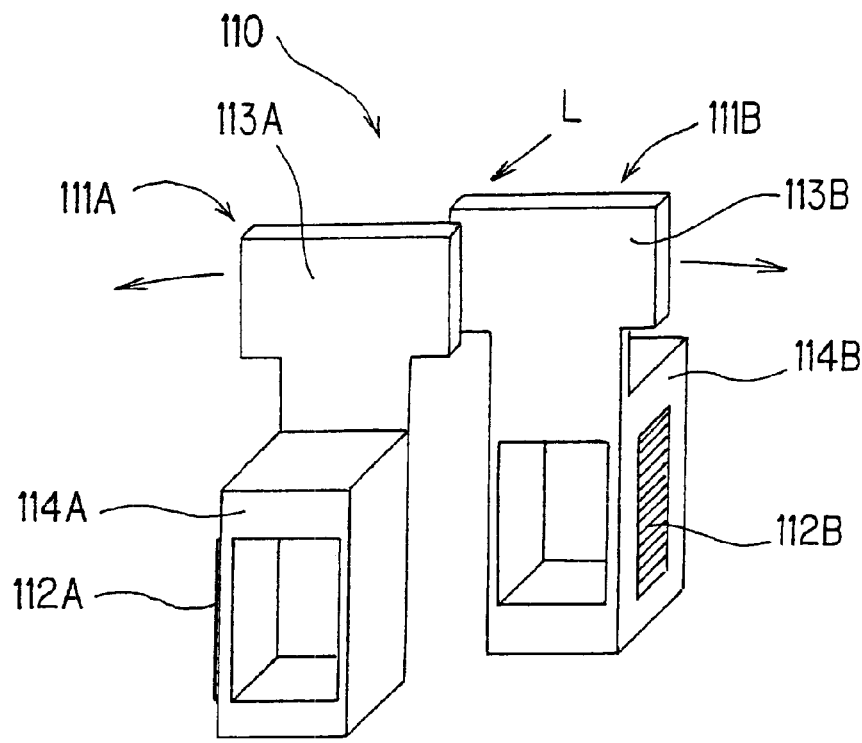
FIGS. 25(*a*) and (*b*) show schematic explanatory views of an embodiment of an optical shutter of the present invention, and FIG. 25(*a*) shows a perspective view thereof, and FIG. 25(*b*) shows a top view thereof.

For example, an optical shutter 110 shown in FIGS. 25(a) and (b) comprises units 111A and 111B each provided with a device of the present invention and a shield, and two shields 113A and 113B are respectively attached to movable portions 114A and 114B, mutual plane surfaces are in parallel, and respective parts of the plane surfaces are arranged to overlap each other in a direction of incidence of light L.

Figure 25B:
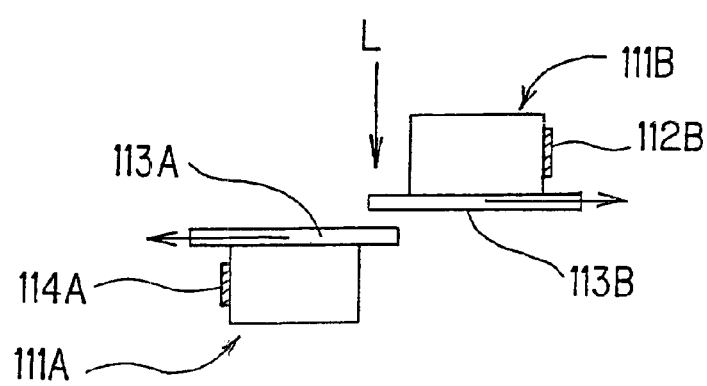

Although an optical shutter 110 shields the light L in the state shown in FIG. 25, since a shield 113A moves to the left and a shield 113B moves to the right in FIG. 25, by applying voltages of the same phase to piezoelectric elements 112A and 112B formed on the moving portion of the device, overlapping condition of the shields 113A and 113B is changed, and ON/OFF of the light and quantity of the light can be controlled.

Figure 26A:
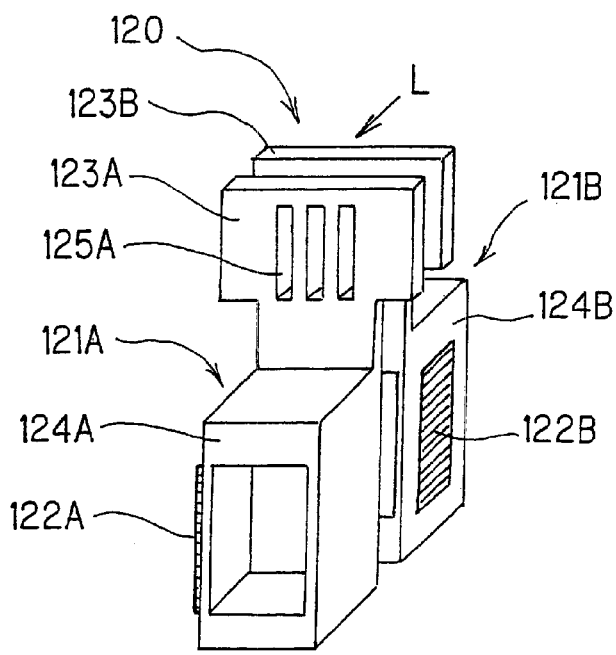
FIGS. 26(*a*), (*b*), and (*c*) show schematic explanatory views of another embodiment of an optical shutter of the present invention, and FIG. 26(*a*) shows a perspective view, FIG. 26(*b*) shows a top view, and FIG. 26 (*c*) shows an enlarged view of a shield.

Further, an optical shutter 120 shown in FIG. 26(a) comprises two units 121A and 121B each provided with a device and a shield of the present invention, two shields 123A and 123B are attached to movable portions 124A and 124B of respective devices respective plane surfaces are arranged in parallel, and respective whole plane surfaces are arranged so as to overlap totally against an incident direction of the light L. On the shields 123A and 123B, slits 125A and 125B are formed at respectively opposing positions.

Figure 26C:
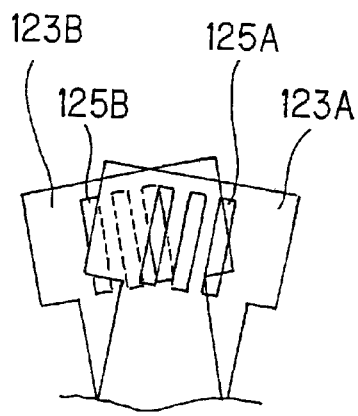
Figure 26B:
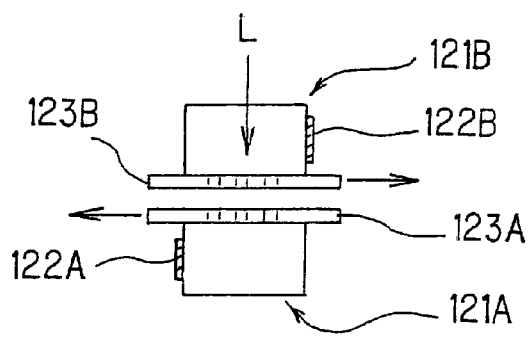

Although the optical shutter 120 transmits the light L through the slits 125A and 125B in the state as shown in FIGS. 26(a) and (b), since the shield 123A moves to the left and the shield 123B moves to the right in FIG. 26, by applying voltages in the same phase to piezoelectric elements 122A and 122B formed on the movable portion of the device, an overlapping condition of the slits 125A and 125B is changed, and ON/OFF of the light and quantity of the light can be controlled. Although, in FIG. 26(c), a state where a part of the light is transmitted, by changing the shape and forming position of the slits 123A and 123B, it is also possible to completely shield the light L.

Contrarily, in the state shown in FIGS. 26(*a*) and (*b*), a structure may be that the slits 125A and 125B do not overlap each other and shield the light L, and by moving shields 123A and 123B, the slits 125A and 125B overlap each other, and the light L can be transmitted. Although, in examples of FIGS. 25 and 26, examples where two shields are attached to respective devices are shown, the optical shutter of the present invention can control transmission and shielding of the light only by attaching at least one shield on the device and moving only the one shield. However, it is preferable that both shields are attached to the device in the point that relative movement quantity of the shields can be increased. Further, in examples shown in FIGS. 25 and 26, while an optical shutter comprises two units, the optical shutter may comprise three or more units. In this case, by setting a variety of movement directions for a plurality of shields, the optical shutter may be used as an optical diaphragm or the like with an overlapping portion with changed degrees of aperture. Since the optical shutter of the present invention has a shield attached to the movable portion of the device of the present invention, operation of the shield in a flapped direction is controlled. In other words, as a shield always moves facing straight to the incident direction of the light, the optical shutter can be preferably used in the point that ON/OFF of the light and quantity of the light can be controlled at higher precision.

Now, a device shown in FIG. 1 is mounted with a piezoelectric element shown in FIG. 17, and a material including platinum as a major component is used for a lower electrode, a material including solid solution of lead magnesium niobate-lead titanate as a major component is used for a piezoelectric film, and gold is used for an upper electrode, and respective members are printed by the screen printing so that the thickness after sintering becomes 3 $\mu$m, 10 $\mu$m, and 0.3 $\mu$m respectively, thus a device is completed. Sintering is performed respectively at 1300° C., 1250° C. and 600° C. at each time of printing. The dimensions of each members according to FIG. 1 are as follows.

a: 0.32 mm, b: 0.3 mm, c: 0.3 mm d: 0.01 mm, e: 1 mm, f: 0.3 mm

Figure 27:
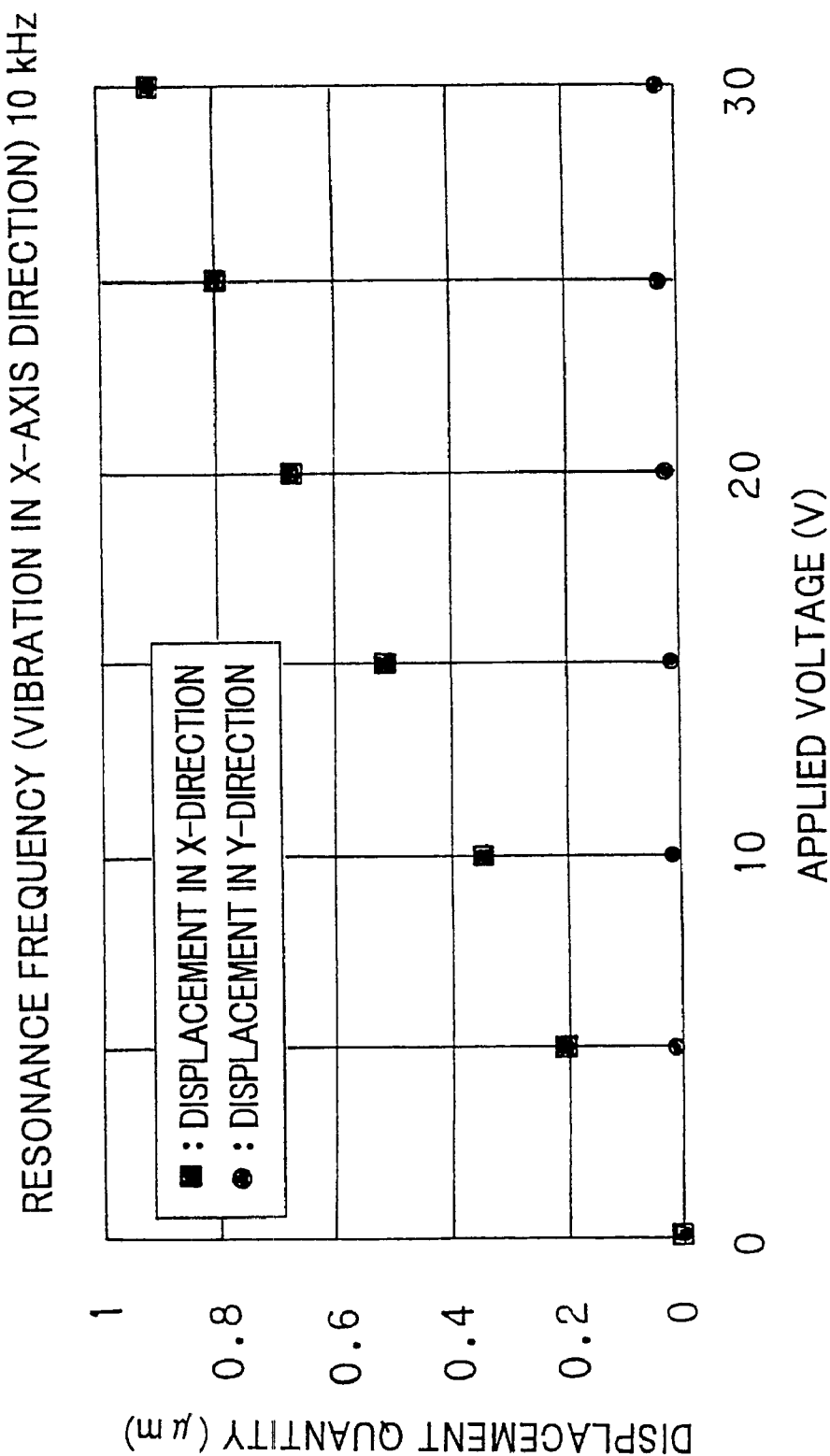
FIG. 27 shows a graph showing measured results of displacement quantities in the X-axis and the Y-axis directions when a pulse voltage is applied to a piezoelectric/electrostrictive device of the present invention by use of the laser Doppler vibrometer.

Displacement quantities of the X-axis direction and the Y-axis direction when a pulse voltage is applied to the piezoelectric element seen on the right of the device are measured by the laser Doppler vibrometer (made by Graphtec Corp). The measurement results are shown in FIG. 27. When displacements are compared at an application voltage of 30 V, the displacement in the Y-axis direction is less than 3% of the displacement in the X-axis, or main axis, direction, and the displacement in the X-axis direction is substantially dominant.

A device according to the present invention is characterized by a structure that the device has higher stiffness in the width direction of the thin plate, namely the Y-axis direction, and therefore, when functional members such as a sensor, a magnetic head, or the like are attached to the present device, and further, when the present device per se is attached to the other structure, the structure permits solid bonding. In addition, because of the stiffness, the device is also characterized in that members of comparatively large mass can be attached. Furthermore, since the stiffness of the thin plate in the thickness direction is relatively smaller than the stiffness in the width direction, a component in the Y-axis direction, or the flapped direction, of the displacement components at the time when the device is operated based on the directional property of the stiffness, can be effectively suppressed, which is a major advantage of the device.

Consequently, the device according to the present invention can be utilized as active elements in various transducers, various actuators, frequency-region functional components, e.g., filters, transformers, vibrators and resonators for communication and motive power, oscillators, discriminators, and the like, and as sensor elements for a variety of sensors such as ultrasonic sensors and acceleration sensors, angular velocity sensors and impact sensors, mass sensors, and the like, and particularly can be preferably utilized for a variety of actuators used in mechanisms for displacement, alignment adjustment and angular adjustment of a variety of precision members or the like of optical instruments, precision apparatuses, and the like.

What is claimed is:

1. A piezoelectric/electrostrictive device comprising a driving portion to be driven by displacement of a piezoelectric/electrostrictive element, a movable portion to be operated by driving said driving portion, and a fixing portion for holding said driving portion and movable portion, said piezoelectric/electrostrictive device being characterized in that said driving portion comprises a pair of thin plates facing each other, and a film-like piezoelectric/electrostrictive element formed on an outer surface of at least one thin plate of said thin plates, said fixing portion is coupled with said movable portion via said driving portion along a length direction of said device, and a hole is defined by an inner wall of said driving portion, an inner wall of said movable portion, and an inner wall of said fixing portion, and has a central axis that extends in an axial direction substantially parallel to said thin plates and substantially perpendicular to said length direction, wherein a ratio a/b of the thickness a of the piezoelectric/electrostrictive device, excluding the thickness of the piezoelectric/electrostrictive element, and the width b of the piezoelectric/electrostrictive device, which extends in said axial direction, is 0.5 to 20, and wherein said device is free of any other holes extending in any direction other than said axial direction.

2. A piezoelectric/electrostrictive device according to claim 1, characterized in that a ratio e/a of the maximum length e of a length of said hole in parallel with the longitudinal direction of the piezoelectric/electrostrictive device and said thickness a is 0.5 to 10.

3. A piezoelectric/electrostrictive device according to claim 2, characterized in that said ratio a/b is 1 to 10, and said ratio e/a is 0.7 to 5.

4. A piezoelectric/electrostrictive device according to claim 1, wherein the movable portion and the fixing portion are in rectangular solid form.

5. A piezoelectric/electrostrictive device comprising a driving portion to be driven by displacement of a piezoelectric/electrostrictive element, a movable portion to be operated by driving said driving portion, and a fixing portion for holding said driving portion and said movable portion, said piezoelectric/electrostrictive device being characterized in that said driving portion comprises a pair of thin plates facing each other, and a film-like piezo-electric/electrostrictive element formed on an outer surface of at least one thin plate of said thin plates, said fixing portion is coupled with said movable portion via said driving portion along a length direction of said device, and a hole is defined by an inner wall of said driving portion, an inner wall of said movable portion, and an inner wall of said fixing portion, and has a central axis that extends in an axial direction substantially parallel to said thin plates and substantially perpendicular to said length direction, wherein the thickness a of said piezoelectric/electrostrictive device, excluding the thickness of the piezoelectric/electrostrictive element, is 100 µm to 2000 µm, and the width b of said piezoelectric/electro-strictive device, which extends in said axial directions, is 100 µm to 2000 µm, and wherein said device is free of any other holes extending in any direction other than said axial direction.

6. A piezoelectric/electrostrictive device according to claim 5, characterized in that said thickness a is 100 µm to 2000 µm, and said width b is 100 µm to 500 µm.

7. A piezoelectric/electrostrictive device according to claim 6, characterized in that the thickness d of the thin plate of said piezoelectric/electrostrictive device is 2 µm to 100 µm.

8. A piezoelectric/electrostrictive device according to claim 7, characterized in that the maximum length of a length of said hole in parallel with the longitudinal direction of the piezoelectric/electrostrictive device is 300 µm to 3000 µm.

9. A piezoelectric/electrostrictive device according to claim 7, characterized in that a length f of said movable portion in parallel with the longitudinal direction of said piezoelectric/electrostrictive device is 50 µm to 2000 µm.

10. A piezoelectric/electrostrictive device according to claim 1, wherein said piezoelectric/electrostrictive device has at least two driving portions.

11. A piezoelectric/electrostrictive device according to claim 1, wherein said piezoelectric/electrostrictive element is a laminated type piezoelectric/electrostrictive element laminated by a lower electrode, a piezoelectric/electrostrictive film, and an upper electrode.

12. A piezoelectric/electrostrictive device according to claim 1, wherein said piezoelectric/electrostrictive element comprises a piezoelectric/electrostrictive film, and first and second comb-structure electrodes, and teeth of said first electrode and said second electrode are interleaved with a predetermined width between each tooth of respective combs.

13. A piezoelectric/electrostrictive device according to claim 1, wherein the movable portion, the thin plates, and the fixing portion comprise an integrally formed ceramic body.

14. A piezoelectric/electrostrictive device according to claim 13, wherein the ceramic body is a laminated body.

15. A piezoelectric/electrostrictive device comprising a driving portion to be driven by displacement of a piezoelectric/electrostrictive element, a movable portion to be operated by driving said driving portion, and a fixing portion for holding said driving portion and said movable portion, said piezoelectric/electrostrictive device being characterized in that said driving portion comprises a pair of thin plates facing each other, and a film-like piezoelectric/electrostrictive element formed on an outer surface of at least one thin plate of said thin plates, and having a width that is the same as the width of the thin plate and/or a length which exceeds the length of the thin plate constituting said driving portion and extends at least to a part of the movable portion, said fixing portion is coupled with said movable portion via said driving portion along a length direction of said device, and a hole is defined by an inner wall of said driving portion, an inner wall of said movable portion, and an inner wall of said fixing portion and has a central axis that extends in an axial direction substantially parallel to said thin plates and substantially perpendicular to said length direction, wherein said device is free of any other holes extending in any direction other than said axial direction.

16. A piezoelectric/electrostrictive device according to claim 15, wherein the width of the piezoelectric/electrostrictive element is the same as the width of the thin plate.

17. A piezoelectric/electrostrictive device according to claim 15, characterized in that a ratio a/b of the thickness a of said piezoelectric/electrostrictive device, excluding the thickness of the piezoelectric/electrostrictive element, and the width b of said piezoelectric/electrostrictive device is 1 to 10, and a ratio e/a of the maximum length e of a length of said hole in parallel with the longitudinal direction of the piezoelectric/electrostrictive device and said thickness a is 0.7 to 5.

18. A piezoelectric/electrostrictive device according to claim 15, wherein the movable portion and the fixing portion are in rectangular solid form.

19. A piezoelectric/electrostrictive device according to claim 15, wherein said piezoelectric/electrostrictive device has at least two driving portions.

20. A piezoelectric/electrostrictive device according to claim 15, wherein the length of the piezoelectric/electrostrictive element exceeds the length of the thin plate constituting said driving portion and extends to at least a part of the movable portion.

21. A piezoelectric/electrostrictive device according to claim 20 characterized in that a ratio a/b of the thickness a of said piezoelectric/electrostrictive device, excluding the thickness of the piezoelectric/electrostrictive element, and the width b of said piezoelectric/electrostrictive device is 1 to 10, and a ratio e/a of the maximum length e of a length of said hole in parallel with the longitudinal direction of the piezoelectric/electrostrictive device and said thickness a is 0.7 to 5.

22. A piezoelectric/electrostrictive device according to claim 20, wherein the movable portion and the fixing portion are in rectangular solid form.

23. A piezoelectric/electrostrictive device according to claim 20, wherein said piezoelectric/electrostrictive device has at least two driving portions.

* * * * *